United States Patent
Yang et al.

(10) Patent No.: US 10,461,164 B2
(45) Date of Patent: Oct. 29, 2019

(54) COMPOUND SEMICONDUCTOR FIELD EFFECT TRANSISTOR WITH SELF-ALIGNED GATE

(71) Applicant: QUALCOMM Incorporated, San Diego, CA (US)

(72) Inventors: Bin Yang, San Diego, CA (US); Xia Li, San Diego, CA (US); Gengming Tao, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/685,877

(22) Filed: Aug. 24, 2017

(65) Prior Publication Data

US 2018/0337242 A1    Nov. 22, 2018

Related U.S. Application Data

(60) Provisional application No. 62/509,471, filed on May 22, 2017.

(51) Int. Cl.
*H01L 29/423*    (2006.01)
*H01L 29/66*    (2006.01)

(52) U.S. Cl.
CPC .... *H01L 29/4238* (2013.01); *H01L 29/66446* (2013.01); *H01L 29/66462* (2013.01)

(58) Field of Classification Search
None
See application file for complete search history.

(56) References Cited

U.S. PATENT DOCUMENTS

| | | | |
|---|---|---|---|
| 6,127,712 A | 10/2000 | Wu | |
| 8,383,471 B1 | 2/2013 | Shinihara et al. | |
| 8,558,281 B1 | 10/2013 | Regan et al. | |
| 8,686,473 B1 | 4/2014 | Micovic et al. | |
| 8,823,140 B2 | 9/2014 | Nie et al. | |
| 8,877,574 B1 | 11/2014 | Basu et al. | |
| 2002/0167023 A1* | 11/2002 | Chavarkar | H01L 29/7783 257/194 |
| 2007/0262363 A1 | 11/2007 | Tao et al. | |
| 2012/0032230 A1 | 2/2012 | Yin et al. | |

(Continued)

FOREIGN PATENT DOCUMENTS

WO    2013095345 A1    6/2013

OTHER PUBLICATIONS

International Search Report and Written Opinion—PCT/US2018/025909—ISA/EPO—dated Jun. 15, 2018.

*Primary Examiner* — Mounir S Amer
(74) *Attorney, Agent, or Firm* — Seyfarth Shaw LLP

(57) ABSTRACT

A compound semiconductor field effect transistor (FET) may include gallium nitride (GaN) and alloy material layers. The compound semiconductor FET may also include a pair of L-shaped contacts on the GaN and alloy material layers. The compound semiconductor FET may also include a pair of gate spacers between the L-shaped contacts and on the GaN and alloy material layers, each of the pair of gate spacers contacting one of the L-shaped contacts. The compound semiconductor FET may further include a base gate between the pair of gate spacers and on the GaN and alloy material layers, in which the pair of L-shaped contacts are self-aligned with the base gate.

17 Claims, 17 Drawing Sheets

(56) References Cited

U.S. PATENT DOCUMENTS

| | | | |
|---|---|---|---|
| 2012/0208328 A1* | 8/2012 | Anderson | H01L 29/66795 438/151 |
| 2013/0032814 A1* | 2/2013 | Bour | H01L 21/0254 257/76 |
| 2018/0123400 A1* | 5/2018 | Leabman | H03F 3/193 |
| 2018/0145077 A1* | 5/2018 | Dewey | H01L 21/823814 |

* cited by examiner

COMPOUND SEMICONDUCTOR FIELD EFFECT TRANSISTOR WITH SELF-ALIGNED GATE

CROSS-REFERENCE TO RELATED APPLICATION

This application claims the benefit of U.S. Provisional Patent Application No. 62/509,471, filed on May 22, 2017, entitled "COMPOUND SEMICONDUCTOR FIELD EFFECT TRANSISTOR WITH SELF-ALIGNED GATE," the disclosure of which is expressly incorporated by reference herein in its entirety.

BACKGROUND

Field

The present disclosure relates generally to wireless communication systems and, more specifically, to a compound semiconductor field effect transistor including a self-aligned gate.

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), high-electron-mobility transistors (HEMTs), pseudomorphic high-electron-mobility transistors (pHEMTs), and the like.

Design challenges for mobile RF transceivers include performance considerations for meeting future 5G and 5G+ transmission frequency specifications. These future 5G/5G+ performance specifications mandate a ten-fold transmission frequency increase (e.g., 28 gigahertz (GHz) to 60 GHz) over current standards for supporting future transmission frequency specifications. High-electron-mobility transistors may improve upon heterojunction transistors by supporting substantially higher transmission frequencies.

High-electron-mobility transistors are excellent candidates for meeting future 5G/5G+ transmission frequency specifications. Unfortunately, current compound semiconductor (e.g., gallium nitride GaN) transistors, which are mostly used in base stations, have too high of an operating voltage to be useful in mobile devices. GaAs (gallium arsenide) pseudomorphic high-electron-mobility transistors have a lower power density, which make them a poor candidate for implementing power amplifiers of mobile devices (e.g., smartphones) that support 5G/5G+ transmission frequency specifications.

SUMMARY

A compound semiconductor field effect transistor (FET) may include gallium nitride (GaN) and alloy material layers. The compound semiconductor FET may also include a pair of L-shaped contacts on the GaN and alloy material layers. The compound semiconductor FET may also include a pair of gate spacers between the L-shaped contacts and on the GaN and alloy material layers, each of the pair of gate spacers contacting one of the L-shaped contacts. The compound semiconductor FET may further include a base gate between the pair of gate spacers and on the GaN and alloy material layers, in which the pair of L-shaped contacts are self-aligned with the base gate.

A method of making a compound semiconductor field effect transistor (FET) may include depositing a spacer material on sidewalls of a dummy base gate to form a pair of gate spacers having a surface coplanar with the dummy base gate as a coplanar surface of the dummy base gate and the pair of gate spacers. The method may also include depositing a contact material on the pair of gate spacers, the dummy base gate, and a cap layer of the compound semiconductor FET. The method may also include etching the contact material to expose the coplanar surface of the dummy base gate and the pair of gate spacers, and a portion of sidewalls of the pair of gate spacers proximate the coplanar surface to form a pair of L-shaped contacts. The method may further include replacing the dummy base gate with a base gate between the pair of gate spacers and self-aligned with the pair of L-shaped contacts.

A radio frequency (RF) front end module may include a chip, comprising a compound semiconductor field effect transistor (FET), comprising gallium nitride (GaN) and alloy material layers, a pair of L-shaped contacts on the GaN and alloy material layers, a pair of gate spacers between the L-shaped contacts and on the GaN and alloy material layers, each of the pair of gate spacers contacting one of the L-shaped contacts, and a base gate between the pair of gate spacers and on the GaN and alloy material layers, the pair of L-shaped contacts being self-aligned with the base gate. The RF front end module may also include an antenna coupled to an output of the chip.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
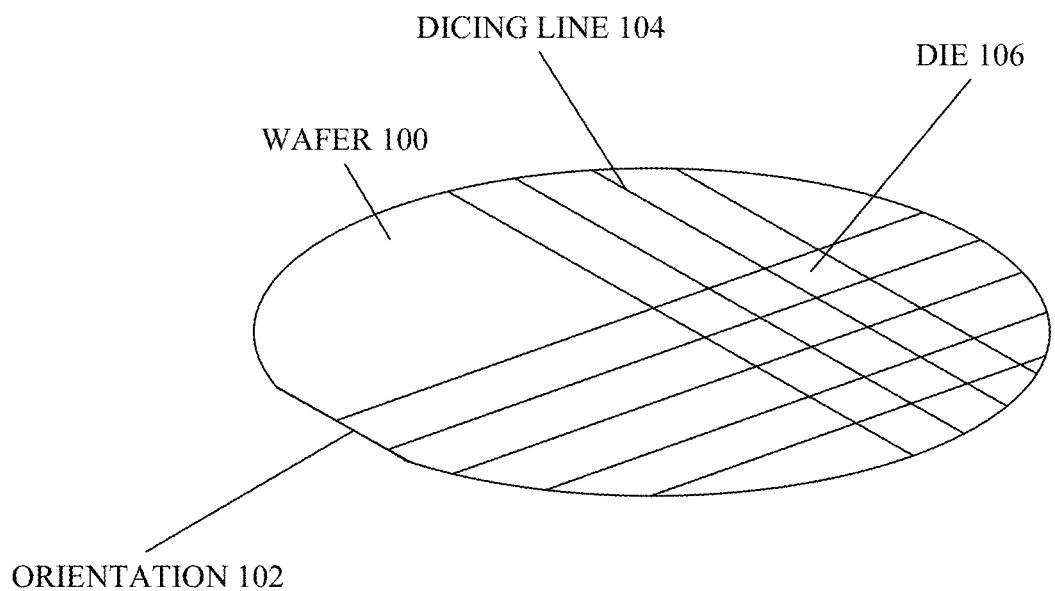
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Fabrication of mobile radio frequency (RF) chips (e.g., mobile RF transceivers) becomes complex at deep submicron process nodes due to cost and power consumption considerations. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal.

The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), high-electron-mobility transistors (HEMTs), pseudomorphic high-electron-mobility transistors (PHEMTs), and the like.

Further design challenges for mobile RF transceivers include performance considerations for meeting future 5G and 5G+ transmission frequency specifications. These future 5G/5G+ transmission frequency specifications mandate a ten-fold transmission frequency increase (e.g., 28 GHz to 60 GHz) over current standards for supporting future performance specifications. Unfortunately, current compound semiconductor transistor solutions, such as bipolar transistors, are unable to meet these future 5G/5G+ transmission frequency specifications.

Bipolar transistors, which are also referred to as bipolar junction transistors (BJTs), are a type of transistor that uses both hole and electron charge carriers. Bipolar transistors are fabricated in integrated circuits and are also used as individual components. Bipolar transistors are designed to amplify current. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor (HBT) is a type of bipolar transistor that uses different semiconductor materials for emitters and base regions of the device, which create a heterojunction. A heterojunction bipolar transistor may use a III-V compound semiconductor material, a II-VI compound semiconductor material, or other like compound semiconductor material. The III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)).

Heterojunction bipolar transistors are often used in high speed circuits, such as RF chip designs including RF power amplifiers in mobile RF transceivers. Unfortunately, heterojunction bipolar transistors are also unable to meet future 5G/5G+ transmission frequency specifications. Heterojunction bipolar transistors are generally unable to meet future 5G/5G+ transmission frequency specifications because they are limited to supporting a transmission frequency of approximately 6 GHz (e.g., limited by transmission frequency/maximum frequency (Ft/Fmax) of approximately 40 GHz).

A high-electron-mobility transistor (HEMT) is a type of field effect transistor (FET) that relies on a junction between different semiconductor materials with different bandgaps to form a heterojunction. A high-electron-mobility transistor may also use a III-V compound semiconductor material, a II-VI compound semiconductor material, or other like compound semiconductor material. High-electron-mobility transistors may improve upon heterojunction transistors by supporting substantially higher transmission frequencies, which may meet future 5G/5G+ performance specifications.

Conventional gallium arsenide (GaAs) pseudomorphic high-electron-mobility transistors (pHEMTs) cannot support a 5G transmission frequency (e.g., 28 GHz-60 GHz). GaAs pseudomorphic high-electron-mobility transistors also have a lower power density, which makes them a poor candidate for implementing a power amplifier of a mobile platform device that supports a 5G transmission frequency. While indium phosphide (InP) heterojunction bipolar transistors may support a transmission frequency/maximum frequency in excess of three-hundred gigahertz (e.g., Ft/Fmax>300 GHz), these devices are also inadequate because the substrate and epitaxial layers are at least five times more expensive.

A gallium nitride (GaN) pseudomorphic high-electron-mobility transistor (pHEMT) is a possible candidate for use within a power amplifier of a mobile platform device. In particular, gallium nitride pseudomorphic high-electron-mobility transistors may support a transmission frequency (Ft)/maximum frequency (Fmax) in excess of one-hundred gigahertz (e.g., Ft/Fmax>100 GHz). The increased transmission frequency supported by gallium nitride pseudomorphic high-electron-mobility transistors is for base station applications rather than mobile platform devices.

For example, gallium nitride pseudomorphic high-electron-mobility transistors specify an increased operation voltage (e.g., 10 volts (V) to 28V) for supporting base station applications. This operating voltage is high relative to an operating voltage (e.g., 3V-5V) for mobile platform devices, such as smartphones. Moreover, these gallium nitride pseudomorphic high-electron-mobility transistors rely on an electron beam (e-beam) process to scale a gate length (Lgate) to approximately 90 nanometers. Unfortunately, the electron beam process is expensive and provides low throughput.

Successful fabrication of modern semiconductor chip products, such as compound semiconductor bipolar transistors and field effect transistors involves interplay between the materials and the processes employed. The process flow for semiconductor fabrication of the integrated circuit structure may include front-end-of-line (FEOL) processes, middle-of-line (MOL) (also referred to as middle-end-of-line (MEOL)) processes, and back-end-of-line (BEOL) processes to form interconnects (e.g., M1, M2, M3, M4, etc.) The front-end-of-line processes may include the set of process steps that form the active devices, such as transistors, capacitors, and diodes.

The front-end-of-line processes include ion implantation, anneals, oxidation, chemical vapor deposition (CVD) or atomic layer deposition (ALD), etching, chemical mechanical polishing (CMP), and epitaxy. The middle-of-line processes may include the set of process steps that enable connection of the transistors to back-end-of-line interconnects. These steps include silicidation and contact formation as well as stress introduction. The back-end-of-line processes may include the set of process steps that form the interconnects that tie the independent transistors and form circuits.

While heterojunction bipolar transistors and pseudomorphic high-electron-mobility transistors offer possible solutions to meeting future 5G/5G+ performance specifications, these transistors suffer from gate alignment issues as well as source/drain-to-gate spacing issues. For example, conventional compound semiconductor (e.g., GaAs, InP, and GaN) high-electron-mobility transistors are generally fabricated without self-aligned gates. The lack of self-aligned gates may be due to space limitations from conventional processing steps. In addition, compound semiconductor heterojunction bipolar transistors that can meet future 5G/5G+ performance specifications are configured to support operating voltages (e.g., 10V-28V) that are substantially higher than the operating voltage (e.g., 3V-5V) for mobile platform devices. Therefore, a desire exists for a device and process with self-aligned gates, while reducing a source/drain-to-gate space to implement, for example, a power amplifier for a mobile platform device.

Aspects of the present disclosure are directed to an innovative compound semiconductor FET having self-aligned gates. In addition, the self-aligned gates may have a reduced source/drain-to-gate space. Such a device and method enable a low cost compound semiconductor FET (e.g., a gallium nitride pseudomorphic high-electron-mobility transistor) device for 5G wireless mobile platform devices. The compound semiconductor FET may have self-aligned source/drain regions, while reducing a source/drain-to-gate space to approximately 10 nanometers (e.g., from a minimum 0.25 micrometers). According to aspects of the present disclosure, a compound semiconductor FET may be a GaN high-electron-mobility transistor (HEMT) or a GaN pseudomorphic high-electron-mobility transistor (pHEMT).

Figure 4A:
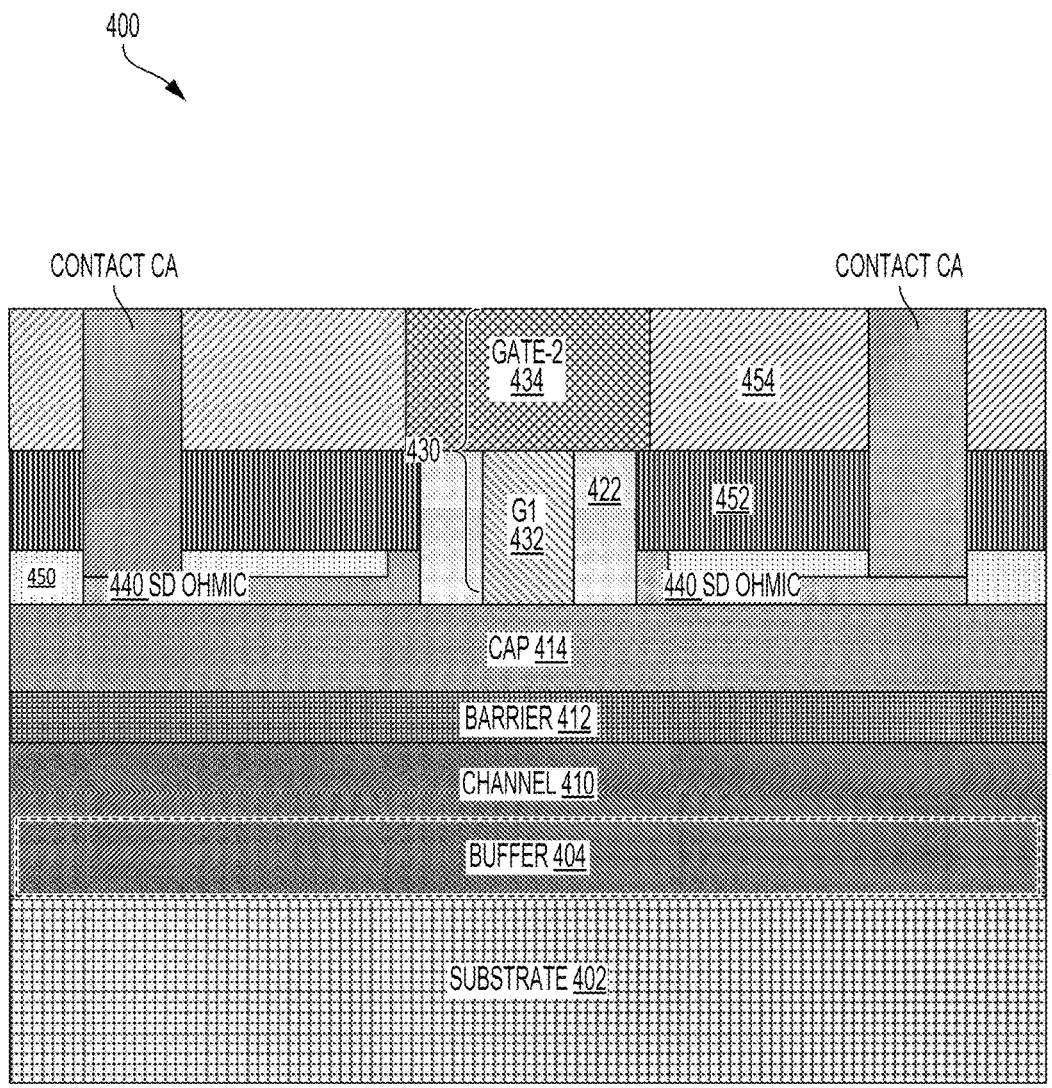
FIG. 4A illustrates a compound semiconductor field effect transistor (FET) in a Schottky configuration, having a self-aligned gate according to aspects of the present disclosure.
Figure 4B:
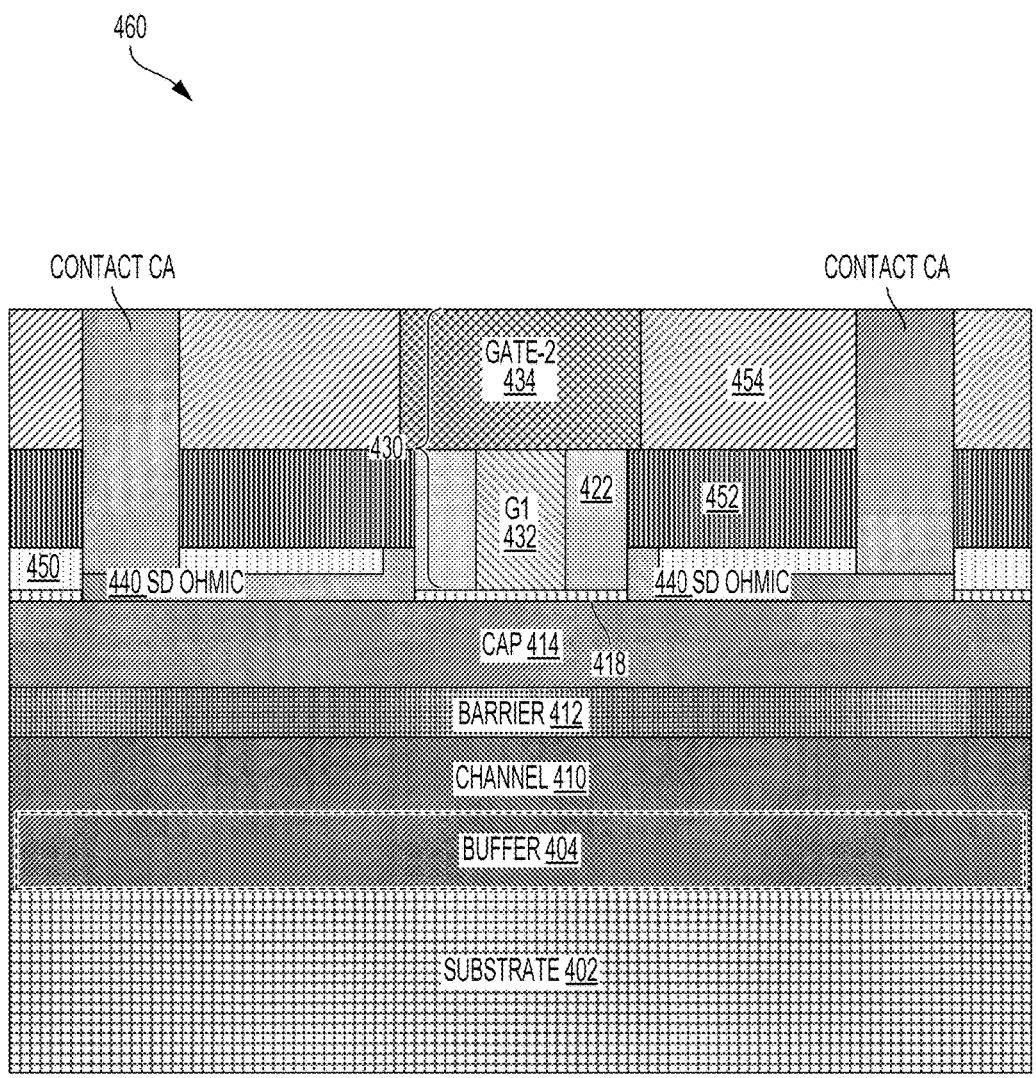
FIG. 4B illustrates a compound semiconductor field effect transistor (FET) in a metal oxide semiconductor (MOS) configuration, having a self-aligned gate according to aspects of the present disclosure.
Figure 5A:
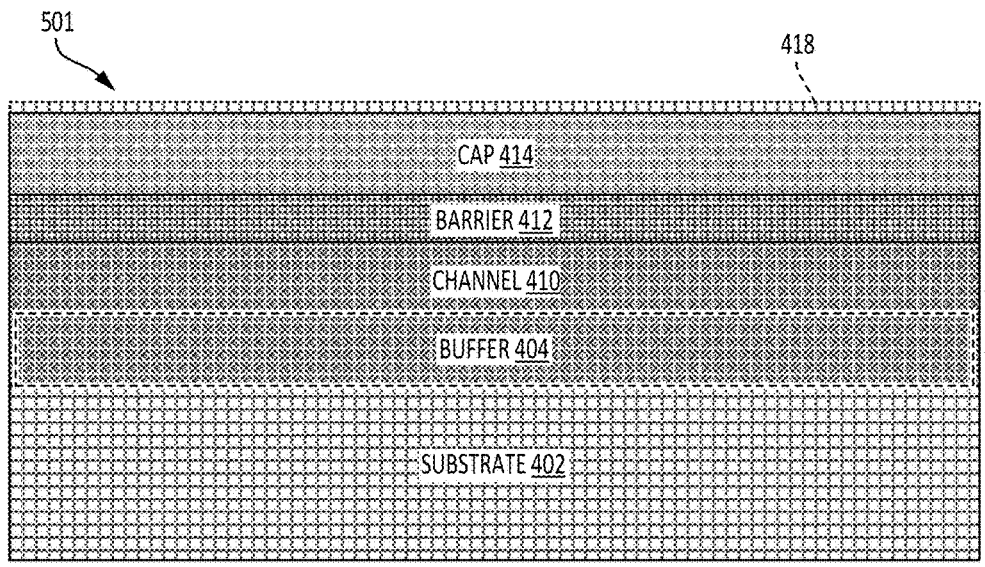
FIGS. 5A-5O illustrate formation of the compound semiconductor field effect transistors (FETs) of FIGS. 4A and 4B according to aspects of the present disclosure.
Figure 5O:
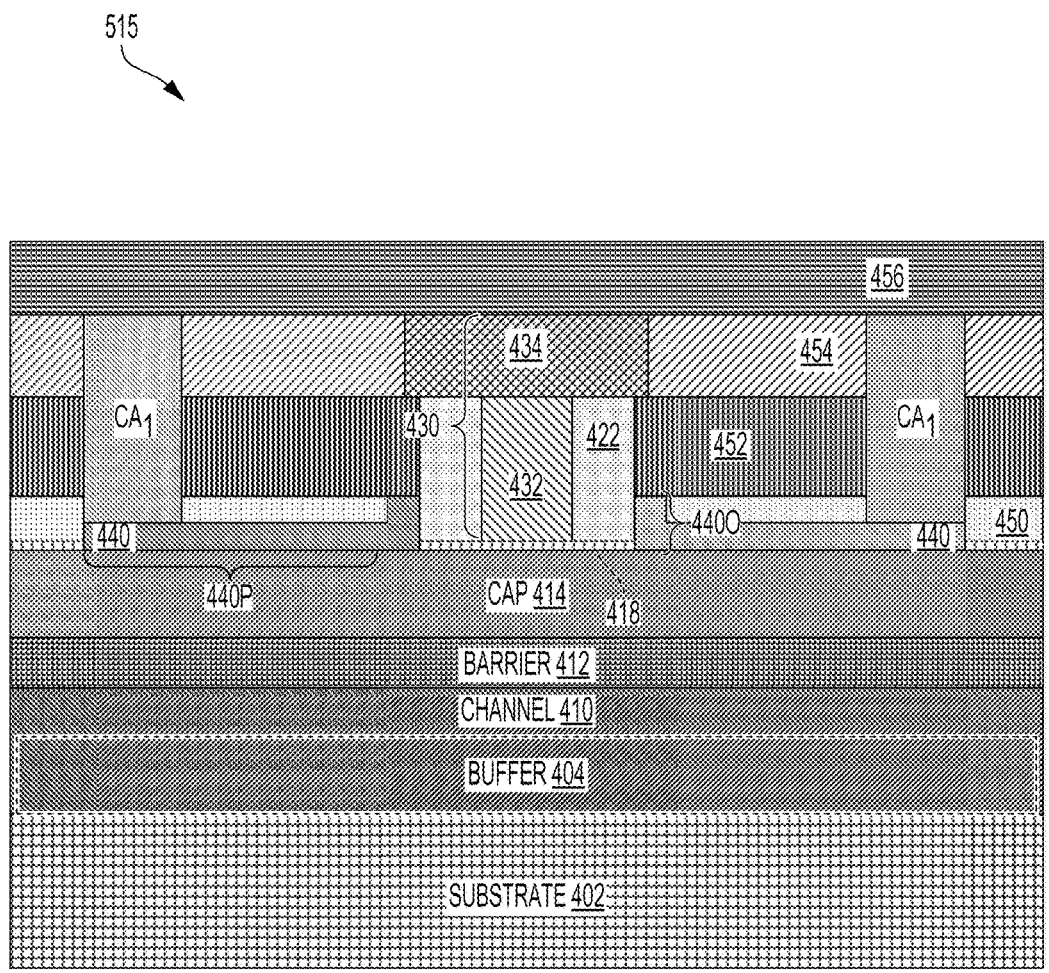
Figure 6A:
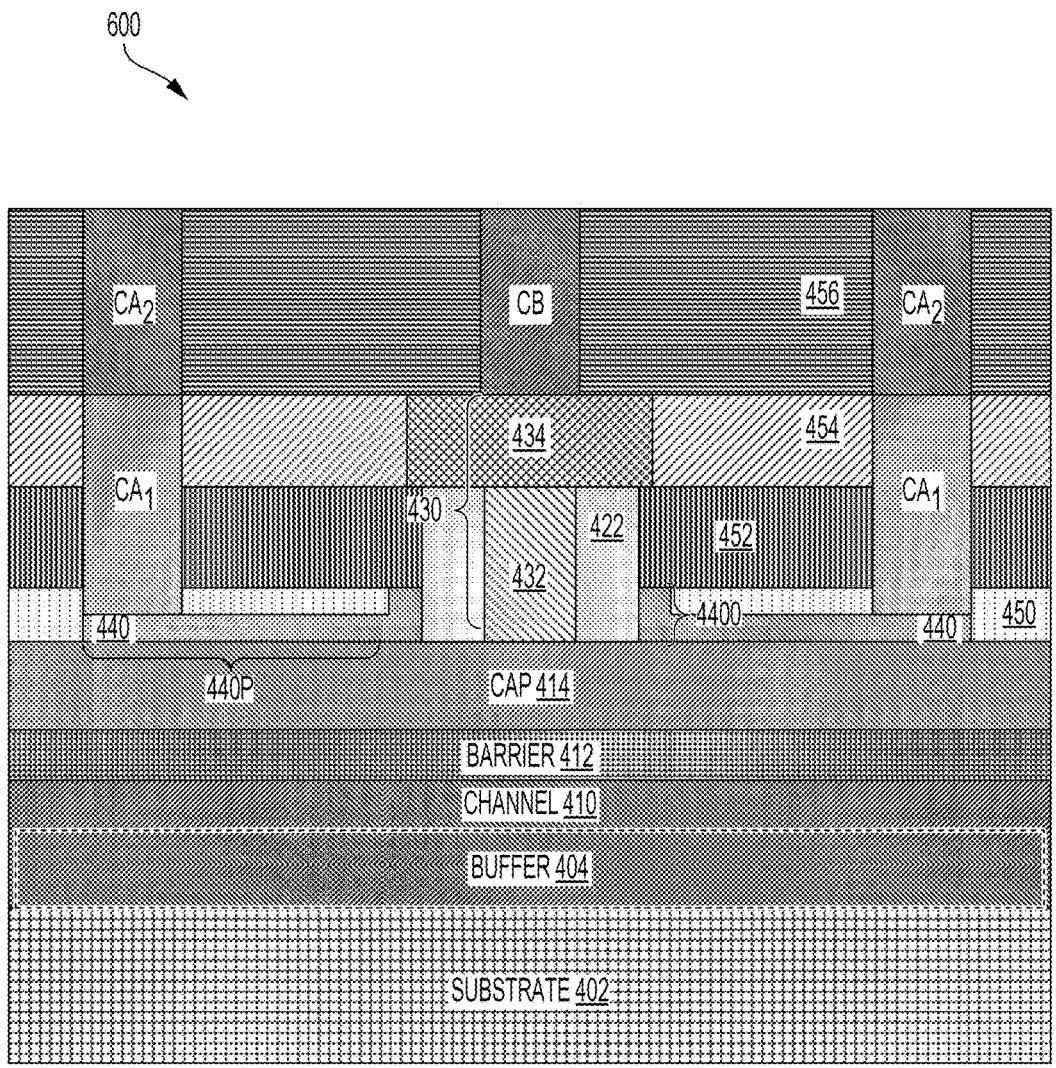
FIG. 6A illustrates a compound semiconductor field effect transistor (FET) in a Schottky configuration, having a self-aligned gate according to further aspects of the present disclosure.

According to aspects of the present disclosure, a gallium nitride FET is described with self-aligned gates having a reduced source/drain-to-gate space, for example, as shown in FIG. 4A, according to Schottky configuration, and FIG. 4B, according to a metal oxide semiconductor (MOS) configuration. A self-alignment process for fabricating the gallium nitride FET of FIGS. 4A and/or 4B is shown in FIG. 5A-5O. One example of a gallium nitride FET is shown in FIG. 6A, according to the Schottky configuration, and in FIG. 6B, in the MOS configuration, according to aspects of the present disclosure.

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be composed of a compound semiconductor material, such as gallium arsenide (GaAs), indium phosphide (InP), or gallium nitride (GaN), a ternary material such as indium gallium arsenide (InGaAs), aluminum gallium arsenide (AlGaAs), or indium gallium stibium (InGaSb), quaternary materials such as indium gallium arsenide phosphide (InGaAsP), or any material that can be a substrate material for other compound semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

After the wafer 100 is processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

After the wafer 100 is separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of packaging that provide access to the die 106. The die 106 may also be directly accessed through wire bonding, probes, or other connections without mounting the die 106 into a separate package.

Figure 2:
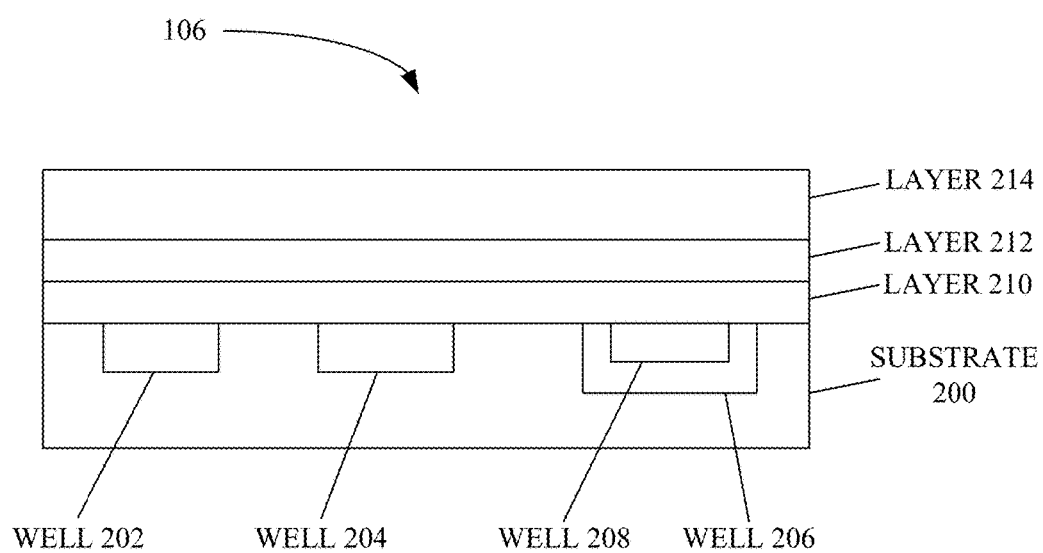
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

The semiconductor substrate may also have a well 206 and a well 208. The well 208 may be completely within the well 206, and, in some cases, may form a bipolar junction transistor (BJT), a heterojunction bipolar transistor (HBT), a high-electron-mobility transistor (HEMT), a pseudomorphic HEMT (pHEMT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure. The substrate 200, the wells 202-208, and the layers (e.g., 210-214) may enable formation of heterojunction bipolar transistors. Heterojunction bipolar transistors are often used in high speed circuits, such as RF chip designs including RF power amplifiers in mobile RF transceivers of a radio frequency (RF) front end module, for example, as shown in FIG. 3.

Figure 3:
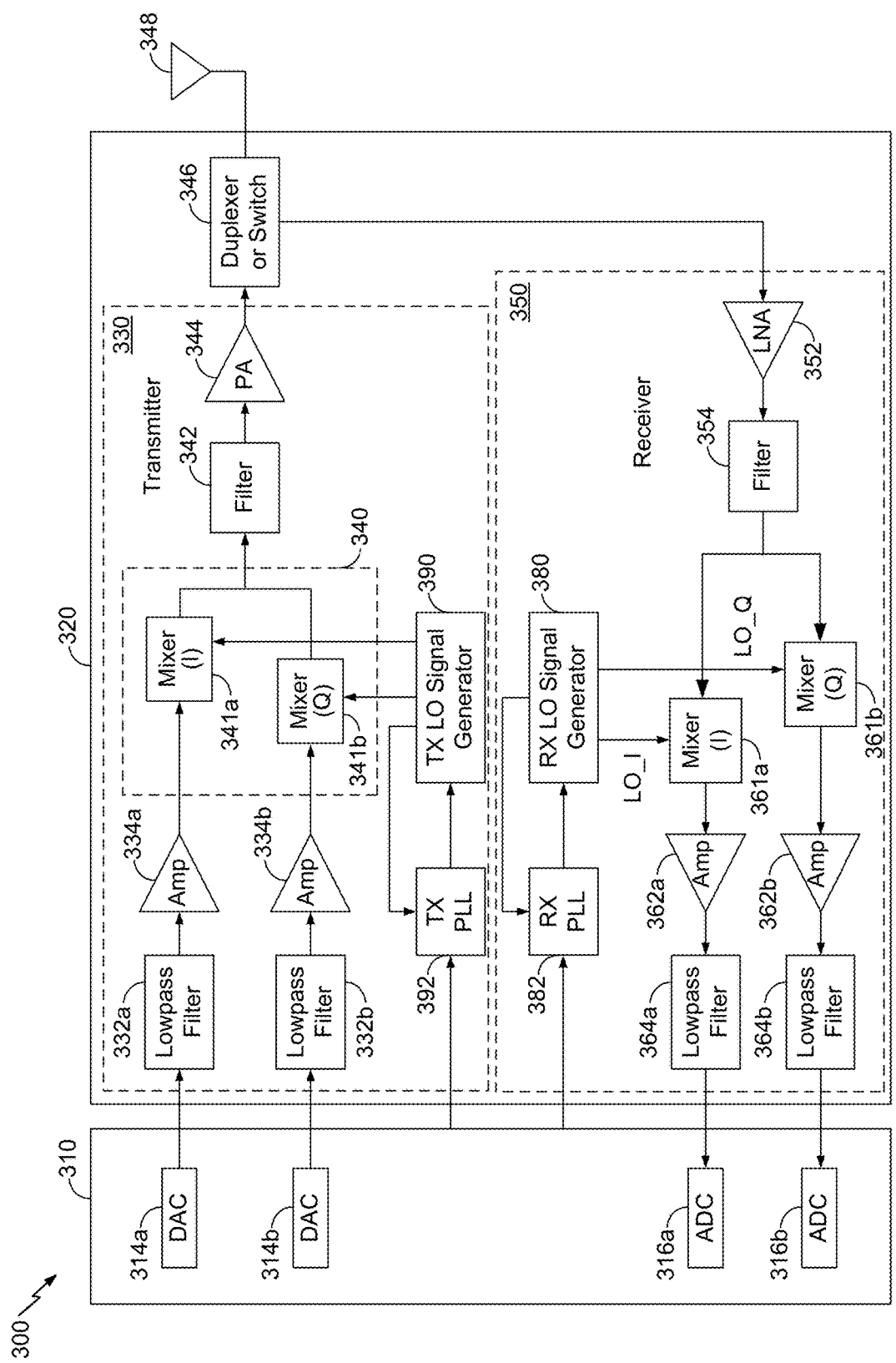
FIG. 3 shows a block diagram of an exemplary wireless device.

FIG. 3 shows a block diagram of an exemplary design of a wireless device 300. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, lowpass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from lowpass filters 332a and 332b, respectively, and provide in-phase (I) and quadrature (Q) baseband signals. An upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The power amplifier 344 may be implemented using a high electron mobility transistor (HEMT), such as a compound semiconductor field effect transistor (FET) having a self-aligned gate, for example, as shown in FIG. 4. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by lowpass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may be implemented using a high-electron-mobility transistor (HEMT). A high electron mobility transistor is a type of field effect transistor (FET) that relies on a junction between different semiconductor materials with different bandgaps to form a heterojunction, similar to a heterojunction bipolar transistor. High-electron-mobility transistors improve upon heterojunction transistors by supporting substantially higher transmission frequencies, which may meet future 5G/5G+ transmission specifications.

While heterojunction bipolar transistors and pseudomorphic high-electron-mobility transistors offer possible solutions to meet future 5G/5G+ performance specifications, these transistors suffer from gate spacing and/or gate alignment issues noted above. For example, conventional compound semiconductor (e.g., GaAs, InP, and GaN) high-electron-mobility transistors are generally fabricated without self-aligned gates. The lack of self-aligned gates may be due to space limitations resulting from conventional processing steps. In addition, compound semiconductor heterojunction bipolar transistors that can meet future 5G/5G+ performance specifications are configured to support operating voltages (e.g., 10V-28V) that are substantially higher than the operating voltage (e.g., 3V-5V) for mobile platform devices.

Aspects of the present disclosure are directed to an innovative compound semiconductor FET having self-aligned gates. In addition, the self-aligned gates may have a reduced source/drain-to-gate space (e.g., a range of 10 nanometers to 20 nanometers). Such a device and method enable a low cost compound semiconductor FET (e.g., a gallium nitride (GaN)) device for 5G wireless mobile platform devices. The gallium nitride FET may have self-aligned source/drain regions, while reducing a source/drain-to-gate space to approximately 10 nanometers (e.g., from a minimum 0.25 micrometers). The reduced source/drain-to-gate space may enable a reduced operating voltage to support mobile platform applications. A gate length is also reduced to a range of 10 nanometers to 20 nanometers. A compound semiconductor FET, including self-aligned gates according to aspects of the present disclosure, is shown in FIGS. 4A and 4B.

FIG. 4A illustrates a compound semiconductor field effect transistor (FET) 400 having a self-aligned gate in a Schottky configuration, according to aspects of the present disclosure. The compound semiconductor FET 400 is shown in a T-gate configuration. Representatively, the compound semiconductor FET 400 includes a semi-insulating substrate 402 (e.g., silicon (Si), silicon carbide (SiC), or aluminum oxide ($Al_2O_3$)). A buffer layer 404 (optional) is on the semi-insulating substrate 402. The buffer layer 404, which may be composed of a compound semiconductor material (e.g., gallium arsenide (GaAs)), is grown on the semi-insulating substrate 402 to isolate defects from the semi-insulating substrate 402. The buffer layer 404 provides a smooth surface on which to grow the active layers of the compound semiconductor FET 400. The buffer layer 404, however, is optional, such that the active layers may be grown directly on the semi-insulating substrate 402.

The compound semiconductor FET 400 also includes a channel 410, which is generally grown after the buffer layer 404 and may be composed of gallium nitride (GaN), or other like compound semiconductor materials. Ideally, all electron conduction of the compound semiconductor FET 400 should take place in the channel 410. A barrier layer 412 (e.g., aluminum gallium nitride (AlGaN)) is grown on the channel 410. In addition, a cap layer 414 (e.g., GaN) is grown on the barrier layer 412. Additional details for forming the cap layer 414, the barrier layer 412, the channel 410, and the buffer layer 404 are omitted to avoid obscuring innovative details of the present disclosure.

In aspects of the present disclosure, the compound semiconductor FET 400 includes a gate 430, having a base gate 432 (G1) including dielectric gate spacers 422. A width of the dielectric gate spacers 422 determines a reduced gate to source/drain space (e.g., 10 nanometers to 20 nanometers), which supports a lower operating voltage (e.g., 3V-5V). The gate 430 also includes a head gate 434 according to the T-gate configuration shown in FIG. 4A. The base gate 432 is self-aligned with source/drain ohmic contacts 440, having a predetermined shape (e.g., an "L" shape). Although shown as L shaped, other configurations of the source/drain ohmic contacts 440 are possible, according to aspects of the present disclosure. In addition, the gate 430 may be an asymmetric T-gate, a symmetric T-gate, or a gamma gate.

As further illustrated in FIG. 4A, a first dielectric layer 450 surrounds the source/drain ohmic contacts 440. The first dielectric layer 450 may be a spin-on dielectric, as described in further detail below. A second dielectric layer 452 surrounds the base gate 432. In addition, a third dielectric layer 454 surrounds the head gate 434. Also shown are source/drain trench (CA) contacts to the source/drain ohmic contacts 440. As noted, the compound semiconductor FET 400 is shown in a Schottky configuration in FIG. 4A. The compound semiconductor FET 400 may be configured according to a metal oxide semiconductor (MOS) configuration by adding a gate oxide (dielectric) layer between the base gate 432 and the cap layer 414, for example, as shown in FIG. 4B.

FIG. 4B illustrates a compound semiconductor FET 460 in the MOS configuration (e.g., a MOSHEMT), having a self-aligned gate according to aspects of the present disclosure. As will be recognized, the compound semiconductor FET 460 includes the various compound semiconductor layers (e.g., 402, 404, 410, 412, 414) and gate configuration (e.g., gate 430) as the compound semiconductor FET 400 shown in FIG. 4A. In the MOS configuration shown in FIG. 4B, however, a gate dielectric layer 418 is deposited between the base gate 432 and the cap layer 414. A process for fabricating the compound semiconductor FET 400 in the Schottky configuration of FIG. 4A, or the MOS configuration of FIG. 4B, including a self-aligned base gate according to aspects of the present disclosure, is shown in FIGS. 5A-5O, in which the gate dielectric layer 418 is shown as an optional layer.

FIG. 5A illustrates a portion of the compound semiconductor FET 400 (or 460) after step 501 of a self-aligned gate last process, according to aspects of the present disclosure. FIG. 5A shows the semi-insulating substrate 402 supporting the buffer layer 404 (optional) and the channel 410 (e.g., a channel layer), which are epitaxially grown. The barrier layer 412 is shown on the channel 410, supporting the cap layer 414. The gate dielectric layer 418 is deposited on the cap layer 414 if the compound semiconductor FET 460 of FIG. 4B is being fabricated.

Figure 5B:
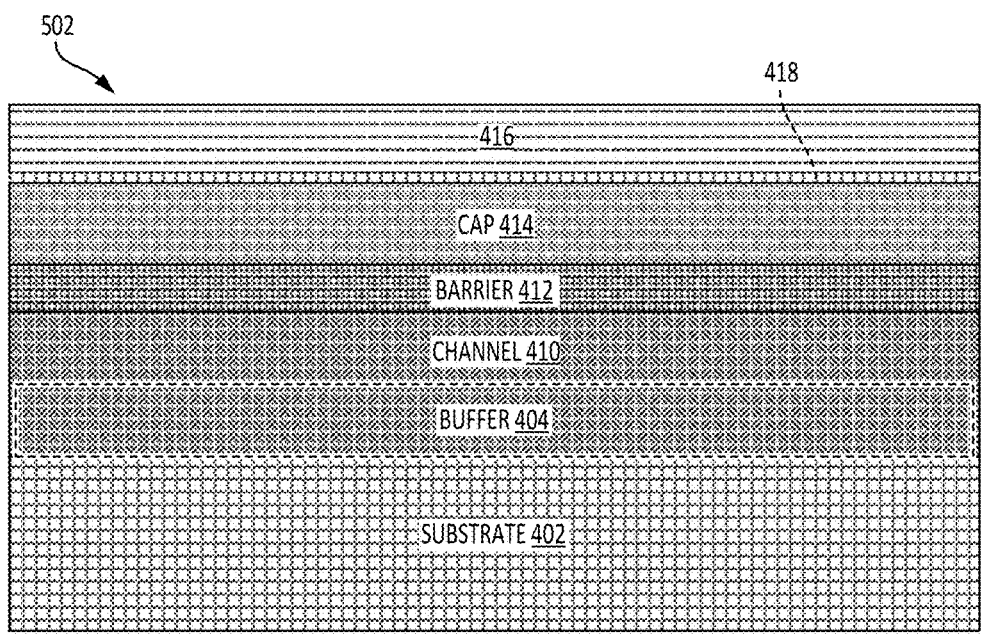

FIG. 5B illustrates a portion of the compound semiconductor FET 400 (or 460) after step 502 of the self-aligned gate last process, according to aspects of the present disclosure. In step 502 of the self-aligned gate last process, an amorphous layer 416 is formed on the cap layer 414. For the MOS configuration of FIG. 4B, the amorphous layer 416 is formed on the gate dielectric layer 418. The amorphous layer 416 (e.g., an amorphous silicon (a-Si)) may be deposited on the cap layer 414 (or the gate dielectric layer 418 for the MOS configuration). A thickness of the amorphous layer 416 may be approximately 100 nanometers. The thickness of the amorphous layer 416 is determined according to desired dimensions of a self-aligned base gate, according to aspects of the present disclosure.

Figure 5C:
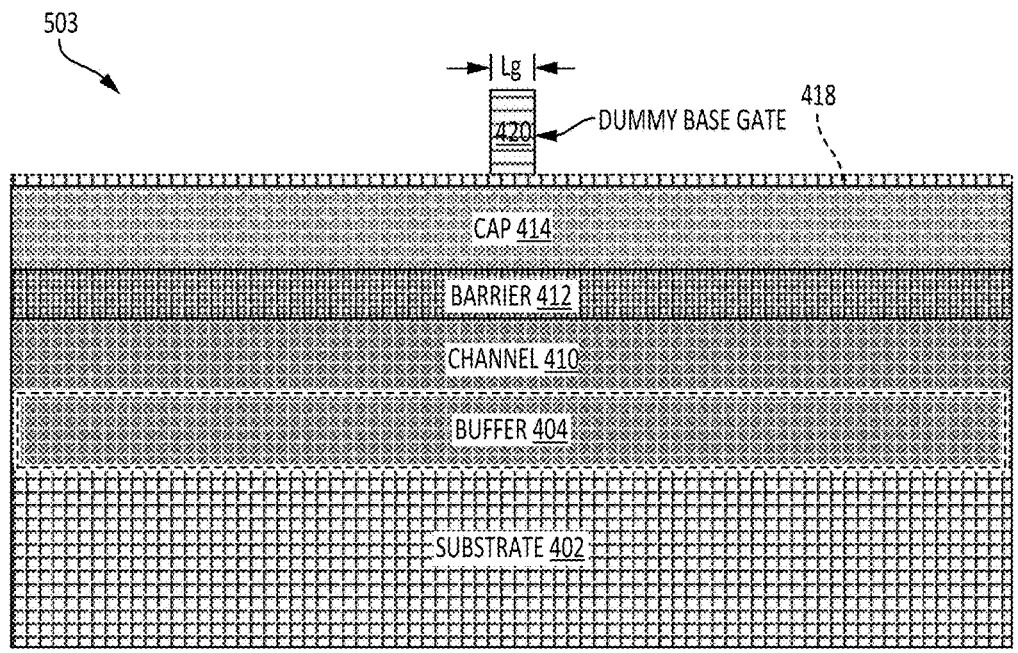

FIG. 5C illustrates a portion of the compound semiconductor FET 400 (or 460) after step 503 of the self-aligned gate last process to form a dummy base gate 420, according to aspects of the present disclosure. The dummy base gate 420 may be formed by a patterning and etching process of the amorphous layer 416 (shown in FIG. 5B). For example, the pattern may determine a gate length (Lg) of the dummy base gate 420, which may be in the range of 10 nanometers to 100 nanometers. The gate length Lg is determined based on the desired dimensions of the self-aligned base gate, according to aspects of the present disclosure.

Figure 5D:
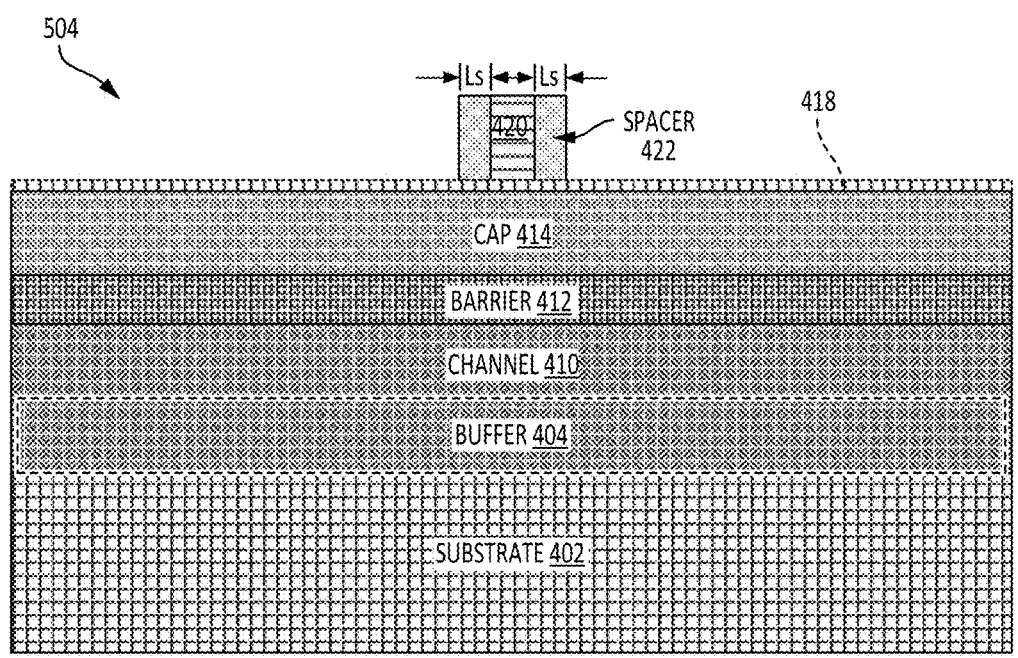

FIG. 5D illustrates a portion of the compound semiconductor FET 400 (or 460) after step 504 of the self-aligned gate last process to form dielectric gate spacers 422, according to aspects of the present disclosure. For example, a dielectric spacer material (e.g., silicon nitride (SiN), silicon oxide ($SiO_2$), or silicon carbon nitro-oxide (SiCNO)) is deposited on sidewalls of the dummy base gate 420 to form the dielectric gate spacers 422. A length of the of the dielectric gate spacers 422 (Ls) may be in the range of 10 nanometers to 20 nanometers. The length Ls of the dielectric gate spacers 422 determines a gate to drain/source distance, which is a minimum of 0.25 microns (or 250 nanometers) in conventional high-electron-mobility transistors (HEMTs).

Figure 5E:
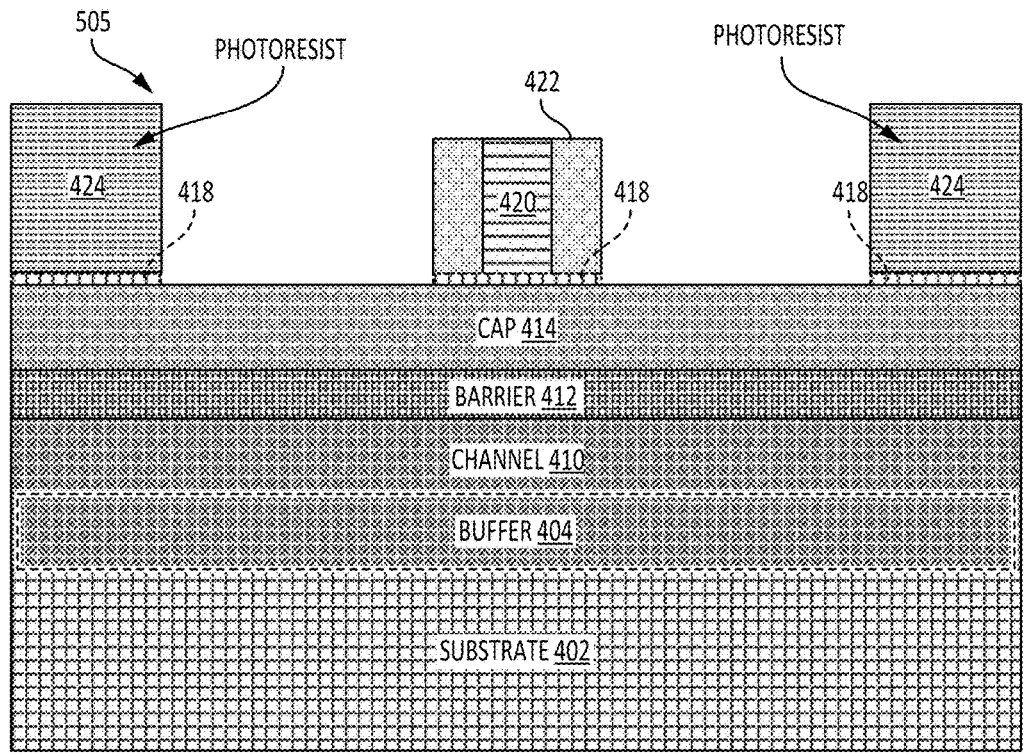

FIG. 5E illustrates a portion of the compound semiconductor FET 400 (or 460) after step 505 of the self-aligned gate last process to form a photoresist pattern 424, according to aspects of the present disclosure. Placement of the photoresist pattern 424 enables a lithograph process that forms source/drain ohmic contacts adjoining the dielectric gate spacers 422. In particular, placement of the photoresist pattern 424 defines a planar portion of the source/drain ohmic contacts, as further illustrated in FIG. 5F. For the MOS configuration of FIG. 4B, the gate dielectric layer 418 is etched to expose portions of the cap layer 414 to enable formation of the source/drain ohmic contacts adjoining the dielectric gate spacers 422.

Figure 5F:
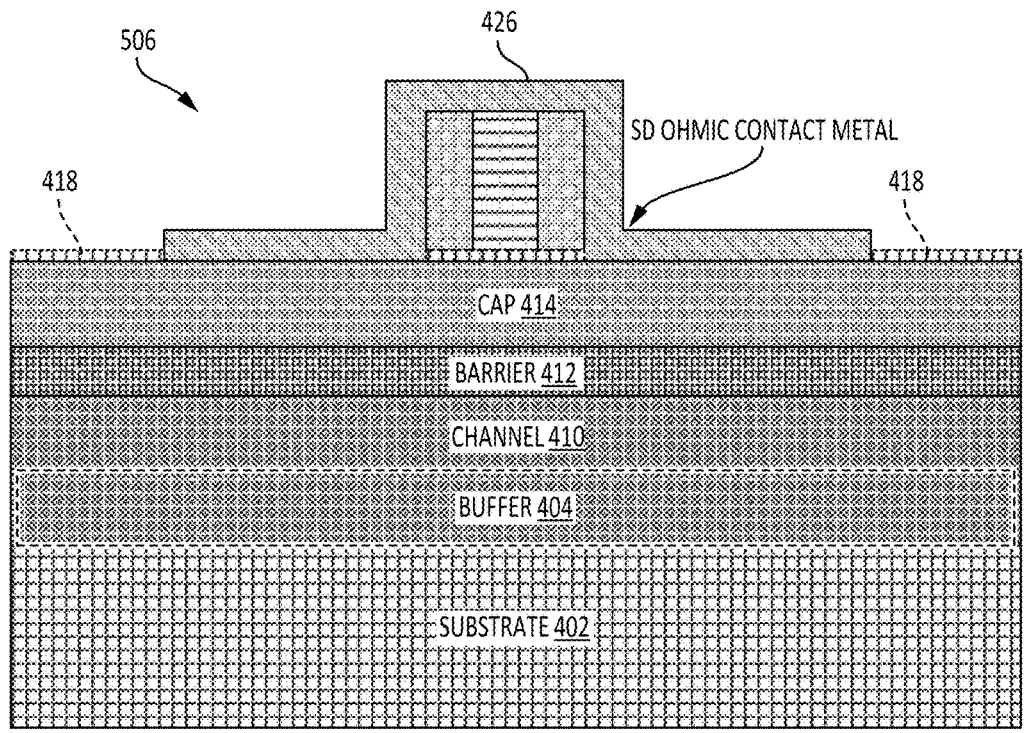

FIG. 5F illustrates a portion of the compound semiconductor FET 400 (or 460) after step 506 of the self-aligned gate last process to begin formation of the source/drain ohmic contacts 440 (FIGS. 4A and 4B), according to aspects of the present disclosure. In this example, a source/drain ohmic contact layer 426 (e.g., titanium (Ti)/aluminum (Al)/gold (Au) of approximately 20 nanometers) may be formed using a contact lithography deposition on the cap layer 414. A lift-off and ohmic anneal process (e.g., at 800° C.) forms the source/drain ohmic contact layer 426. In this example, the source/drain ohmic contact layer 426 is formed in areas of the compound semiconductor FET 400 not covered by the photoresist pattern 424, which is subsequently removed. The source/drain ohmic contact layer 426 forms a portion of the source/drain regions of the compound semiconductor FET 400 (or 460) following the process shown in FIGS. 5G and 5H.

Figure 5G:
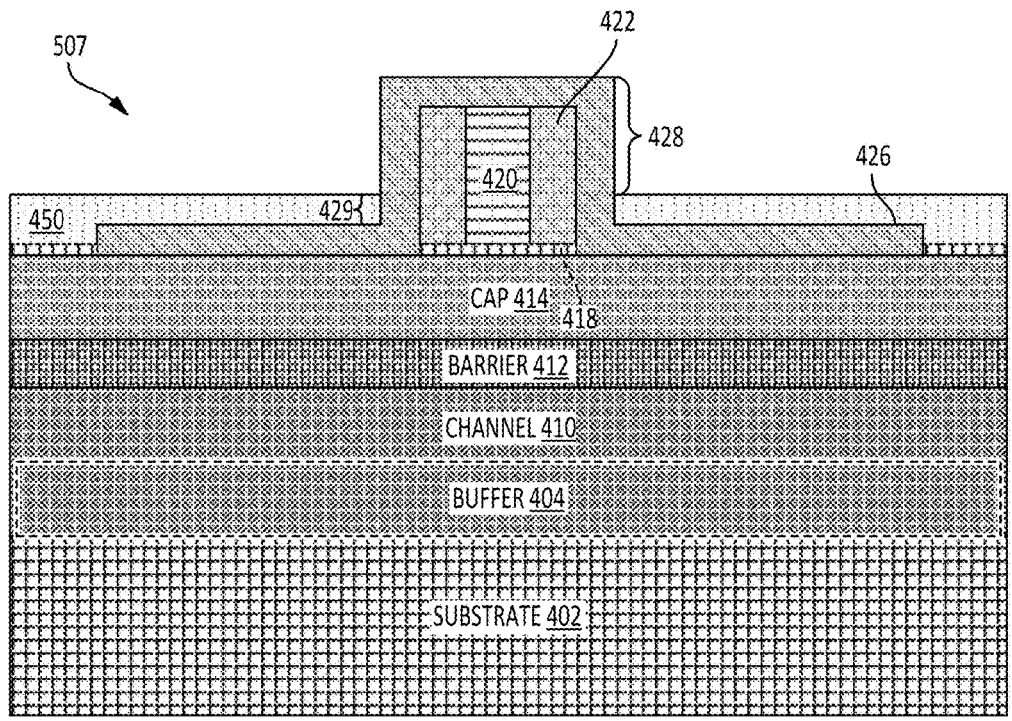

FIG. 5G illustrates a portion of the compound semiconductor FET 400 (or 460) after step 507 of the self-aligned gate last process to form the first dielectric layer 450, according to aspects of the present disclosure. The first dielectric layer 450 may be an oxide layer formed using a spin-on oxide planarization and coating process. This process may coat a portion of the source/drain ohmic contact layer 426 with a spin-on oxide that is liquid at room temperature. The spin-on oxide may be subjected to a bake process (e.g., at 400° C. for approximately 10 minutes) to form the first dielectric layer 450. The first dielectric layer 450 also contacts a portion 429 of the sidewalls of the source/drain ohmic contact layer 426. The first dielectric layer 450 leaves exposed a portion (exposed portion 428) of the source/drain ohmic contact layer 426.

Figure 5H:
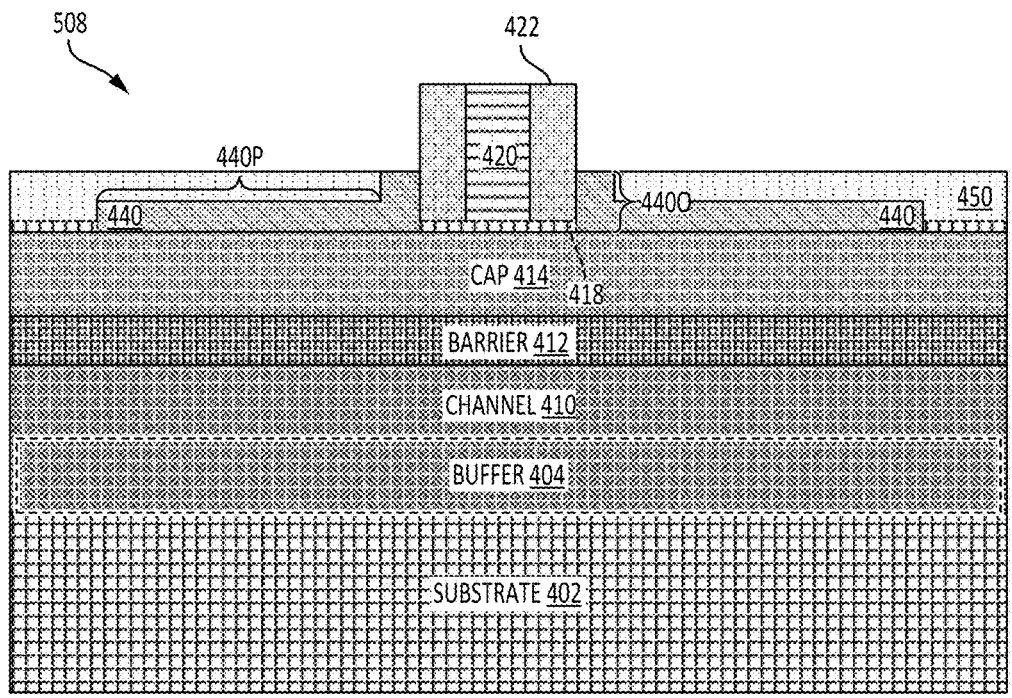

FIG. 5H illustrates a portion of the compound semiconductor FET 400 (or 460) after step 508 of the self-aligned gate last process to form the source/drain ohmic contacts 440, according to aspects of the present disclosure. In this example, an etch process is performed to remove the exposed portion 428 of the source/drain ohmic contact layer 426, as shown in FIG. 5G, to expose a portion of the dummy base gate 420 and the dielectric gate spacers 422 to complete formation of the source/drain ohmic contacts 440. In this example, the source/drain ohmic contacts 440 are shown in an L-shaped configuration, including a planar portion 440P and an orthogonal portion 440O. According to aspects of the present disclosure, adjoining the source/drain ohmic contacts 440 and the dielectric gate spacers 422 enables self-alignment with the dummy base gate 420. This self-alignment also reduces the gate to source/drain space for supporting a lower operating voltage of mobile devices.

Figure 5I:
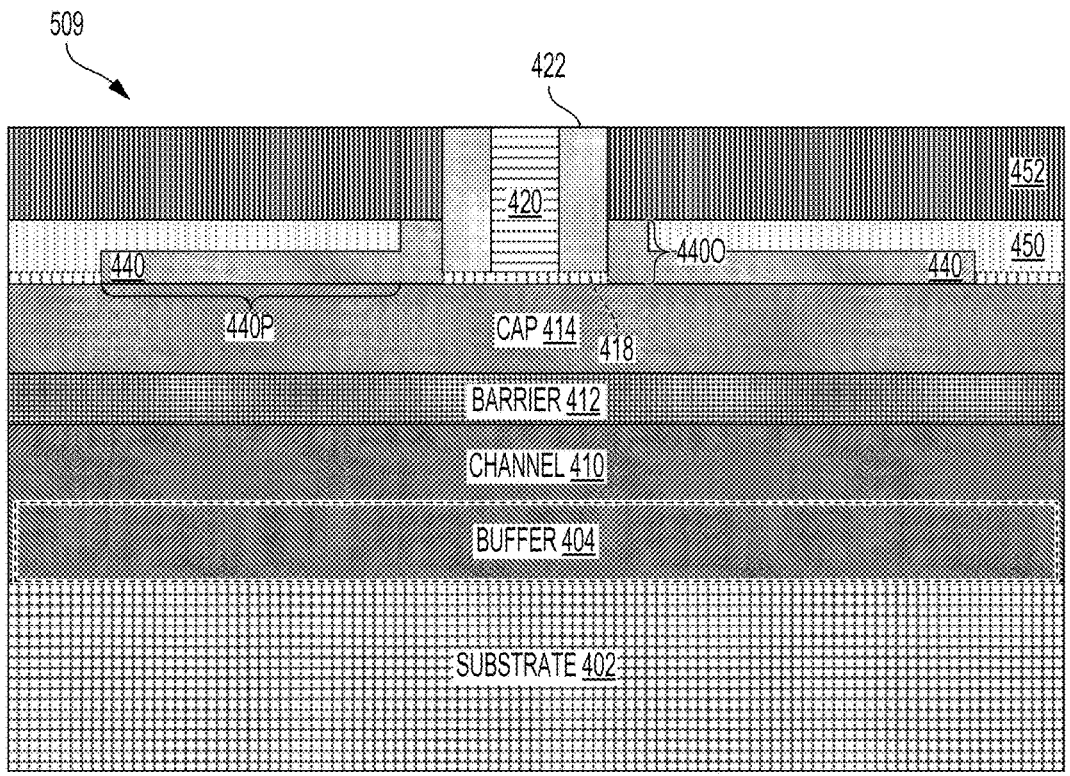

FIG. 5I illustrates a portion of the compound semiconductor FET 400 (or 460) after step 509 of the self-aligned gate last process to form the second dielectric layer 452, according to aspects of the present disclosure. In this example, the second dielectric layer 452 is deposited on the first dielectric layer 450 and each orthogonal portion 440O of the source/drain ohmic contacts 440. The second dielectric layer 452 is also deposited on exposed portions of the dummy base gate 420 and the dielectric gate spacers 422. Once deposited, formation of the second dielectric layer 452 is completed by polishing the second dielectric layer 452 using, for example, a chemical mechanical planarization (CMP) polishing process, which is a novel process for gallium nitride devices.

Figure 5J:
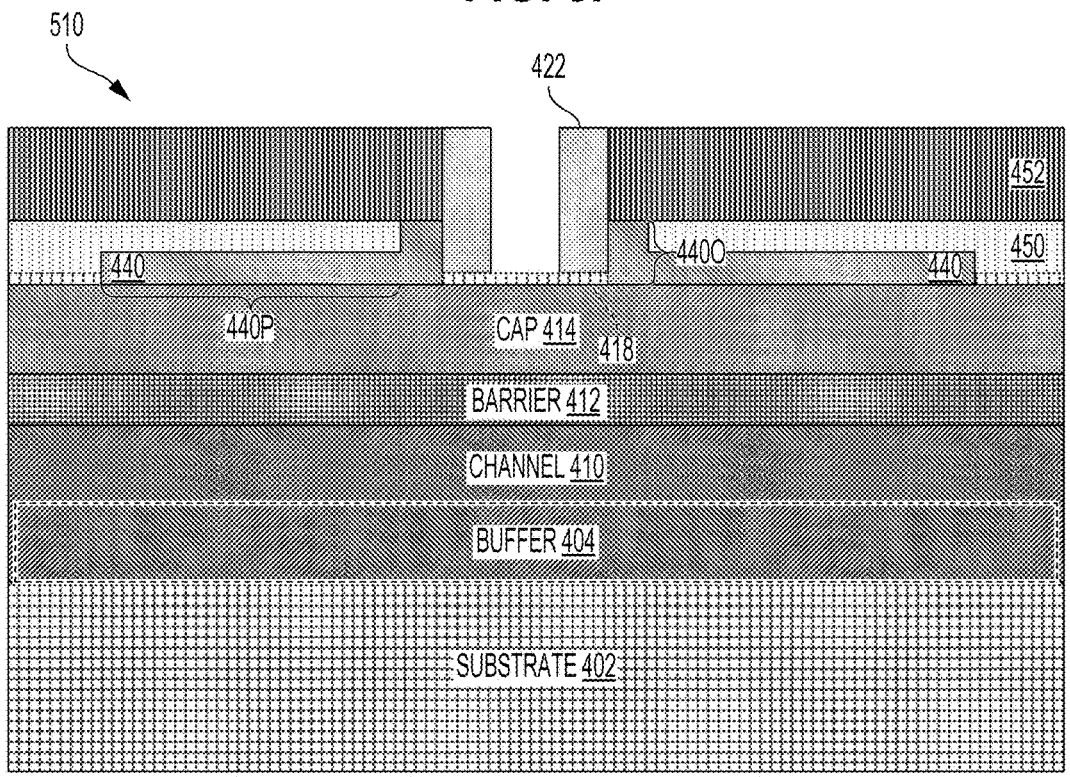

FIG. 5J illustrates a portion of the compound semiconductor FET 400 (or 460) after step 510 of the self-aligned gate last process to remove the dummy base gate 420, according to aspects of the present disclosure. In this example, a wet etch of the amorphous material (e.g., amorphous silicon (a-Si)) of the dummy base gate 420 is performed to remove the dummy base gate 420 and expose the cap layer 414 for the Schottky configuration of FIG. 4A. For the MOS configuration of FIG. 4B, the wet etch is performed to expose the gate dielectric layer 418 This wet etch process is selected to maintain the integrity of the dielectric gate spacers 422.

Figure 5K:
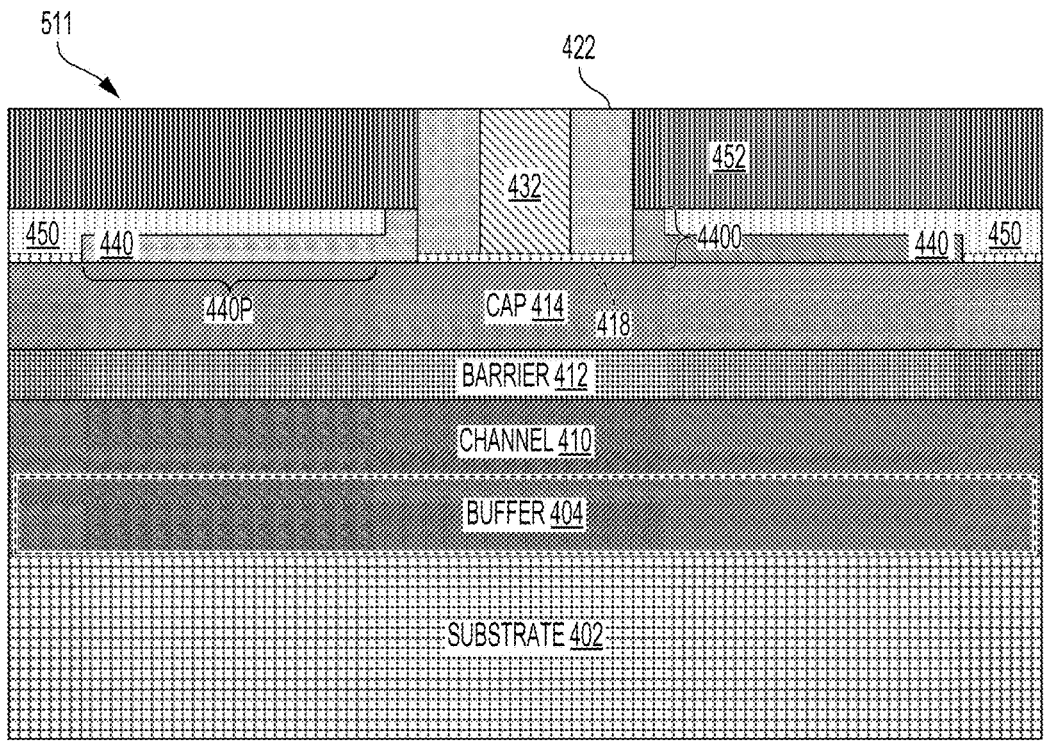

FIG. 5K illustrates a portion of the compound semiconductor FET 400 (or 460) after step 511 of the self-aligned gate last process to form the base gate 432 of the gate 430, according to aspects of the present disclosure. In this example, a space previously occupied by the dummy base gate 420 (FIG. 5J) is filled with a gate material (e.g., nickel (Ni)/titanium (Ti)/gold (Au)/titanium nitride (TiN)). For the MOS configuration of FIG. 4B, the gate material is deposited on the exposed portion of the gate dielectric layer 418. Once filled, the compound semiconductor FET 400 is subjected to a CMP polishing process to complete formation of the base gate 432.

Figure 5L:
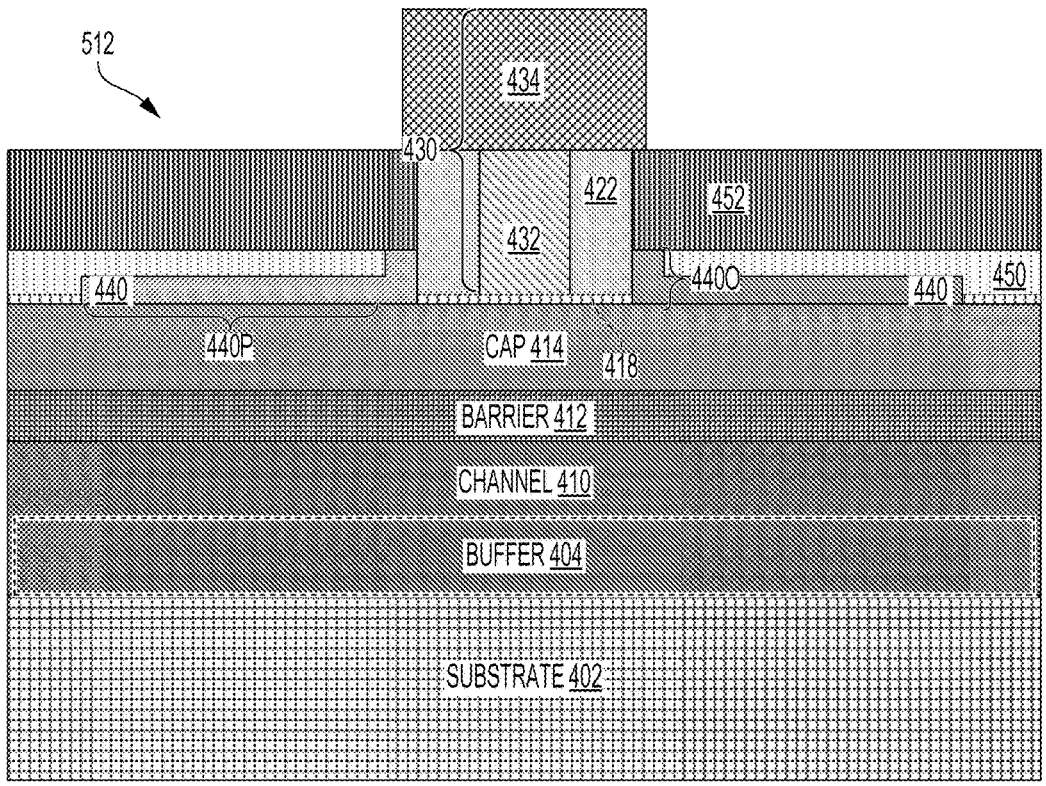

FIG. 5L illustrates a portion of the compound semiconductor FET 400 (or 460) after step 512 of the self-aligned gate last process to form the head gate 434, according to aspects of the present disclosure. Representatively, the head gate 434 is formed on portions of the second dielectric layer 452, as well as exposed portions of the dielectric gate spacers 422 and the base gate 432. Formation of the head gate 434 on the base gate 432 completes formation of the gate 430. In this example, the gate 430 is shown as a T-gate. According to aspects of the present disclosure, the gate 430 may be an asymmetric T-gate, a symmetric T-gate, or a gamma gate. In this example, a size of the head gate 434 is increased to decrease gate resistance, whereas the size of the base gate 432 is reduced to control the frequency. A material of the head gate 434 may be tungsten (W), aluminum (Al), copper (Cu), gold (Au), or other like conductive material.

Figure 5M:
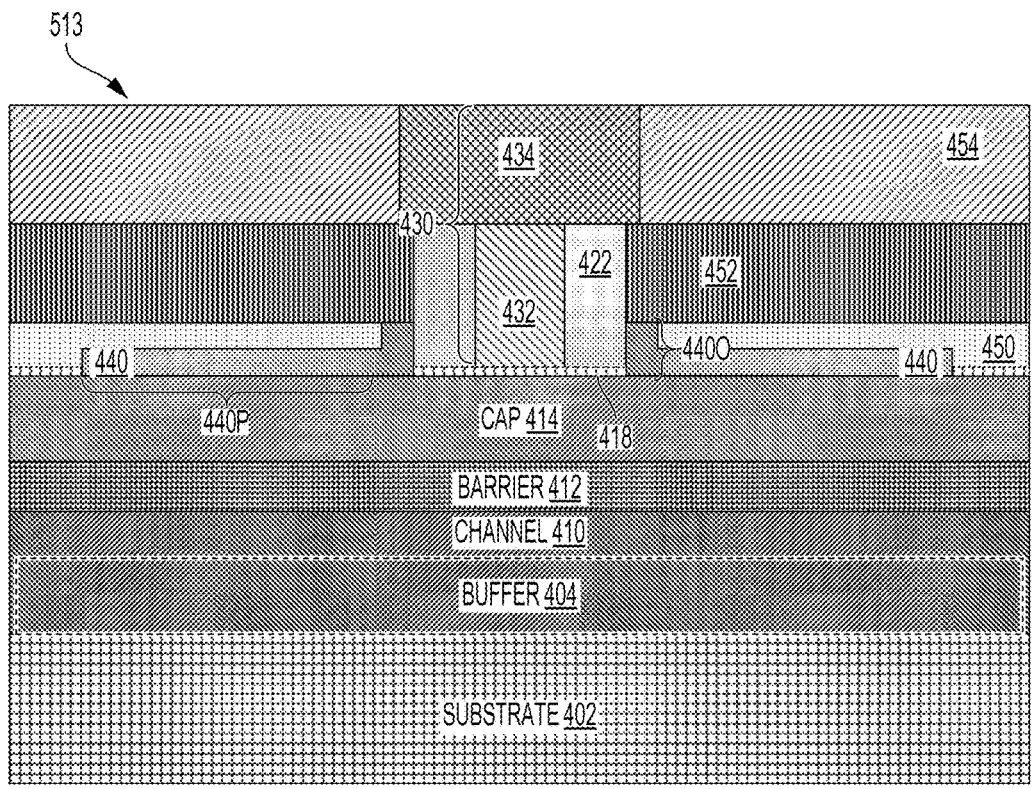

FIG. 5M illustrates a portion of the compound semiconductor FET 400 (or 460) after step 513 of the self-aligned gate last process to form the third dielectric layer 454, according to aspects of the present disclosure. In this example, the third dielectric layer 454 is deposited on the second dielectric layer 452 and sidewalls of the head gate 434. Once deposited, formation of the third dielectric layer 454 is completed by polishing the third dielectric layer 454 using, for example, a CMP polishing process.

Figure 5N:
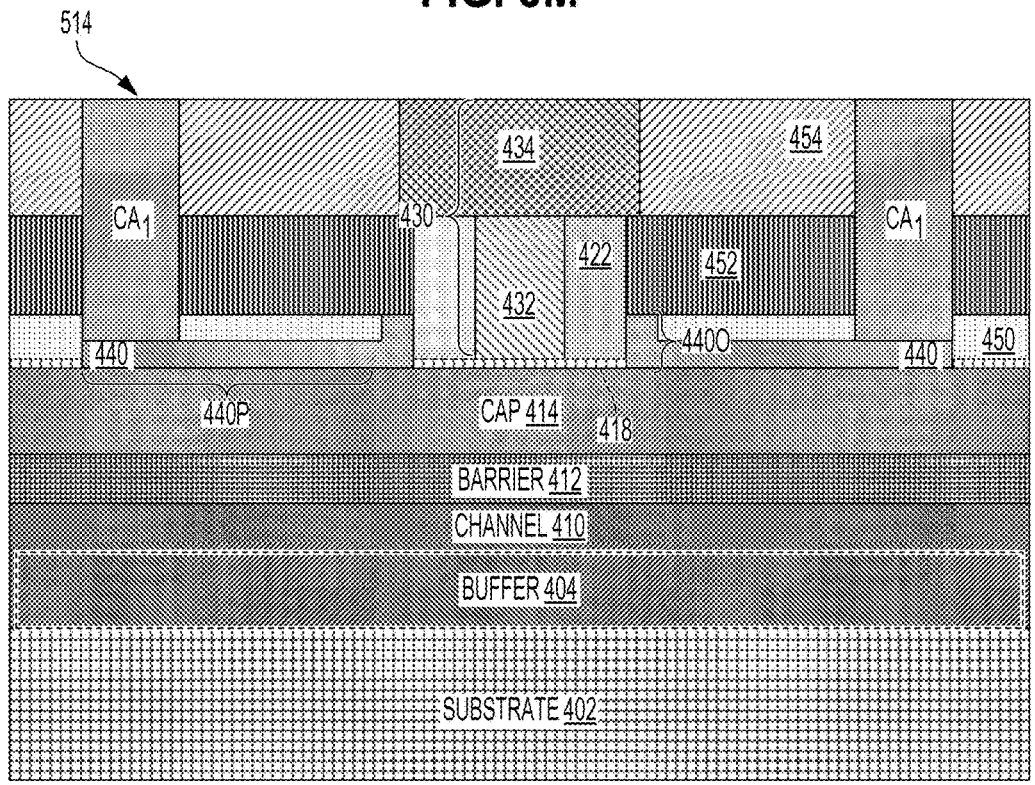

FIG. 5N illustrates a portion of the compound semiconductor FET 400 (or 460) after step 514 of the self-aligned gate last process to form contacts to the source/drain ohmic contacts 440, according to aspects of the present disclosure. In this example, the first dielectric layer 450, the second dielectric layer 452, and the third dielectric layer 454 are etched to expose the planar portion 440P of the source/drain ohmic contacts 440. Next, a conductive material (e.g., tungsten (W) or copper (Cu)) is deposited on each planar portion 440P of the source/drain ohmic contacts 440 to fill the openings for forming source/drain trench (CA$_1$) interconnects (e.g., contact to active interconnects).

FIG. 5O illustrates a portion of the compound semiconductor FET 400 after step 515 of the self-aligned gate last process to form a fourth dielectric layer 456, according to aspects of the present disclosure. In this example, the fourth dielectric layer 456 is deposited on the third dielectric layer 454, on an exposed surface of the head gate 434, and on an exposed surface of the CA$_1$ trench interconnects. Once deposited, formation of the fourth dielectric layer 456 is completed by also polishing the fourth dielectric layer 456 using, for example, a CMP polishing process.

FIG. 6A illustrates a compound semiconductor FET 600 in a Schottky configuration, including a self-aligned gate having a reduced gate to source/drain space, according to aspects of the present disclosure. The compound semiconductor FET 600 is shown in a self-aligned T-gate configuration. In contrast to the compound semiconductor FET 400 of FIG. 4A, the compound semiconductor FET 600 includes stacked trench (CA$_2$) interconnects on the CA$_1$ trench interconnects. In addition, a gate (CB) interconnect to the head gate 434 is shown as extending through the fourth dielectric layer 456.

Figure 6B:
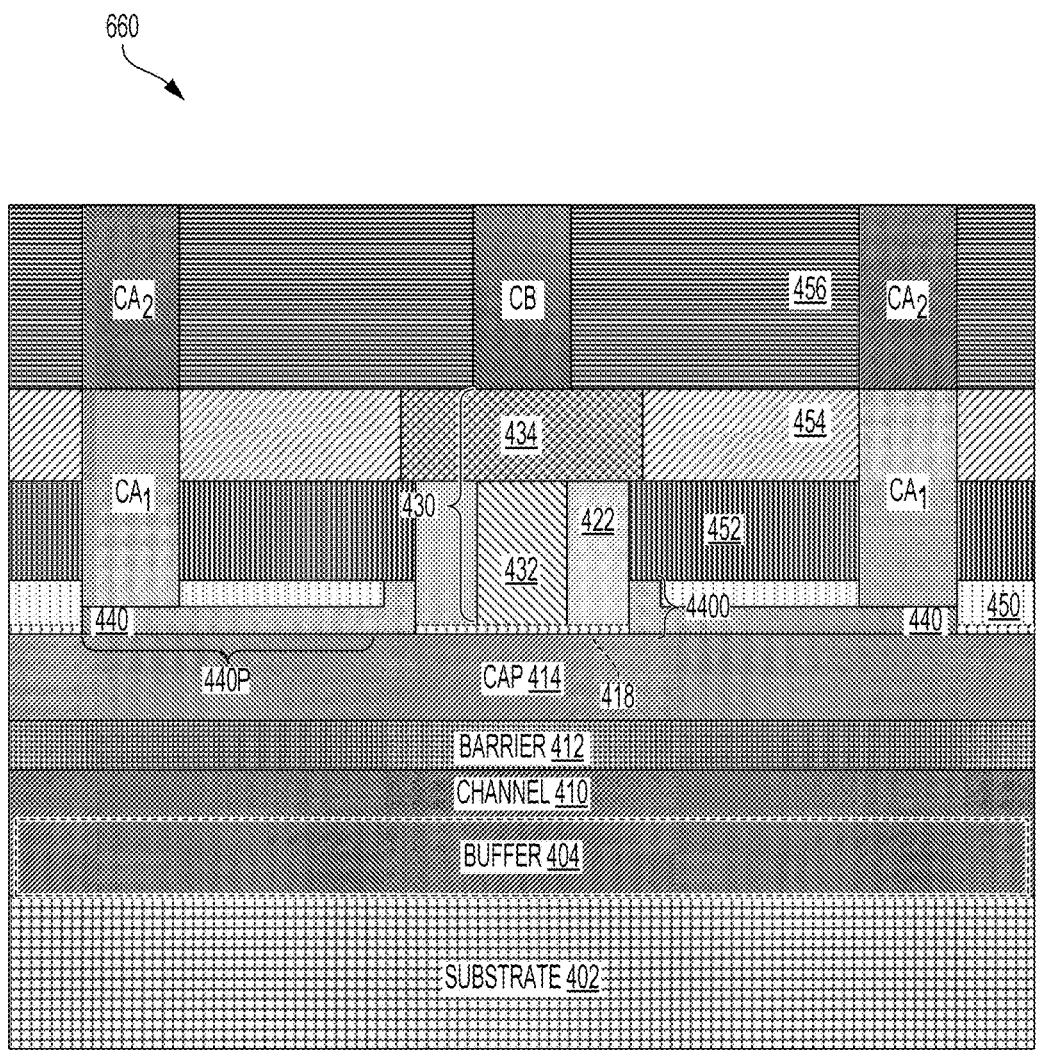
FIG. 6B illustrates a compound semiconductor field effect transistor (FET) in a metal oxide semiconductor (MOS) configuration, having a self-aligned gate according to further aspects of the present disclosure.

FIG. 6B illustrates a compound semiconductor FET 660 in a MOS configuration, including a self-aligned gate having a reduced gate to source/drain space, according to aspects of the present disclosure. The compound semiconductor FET 660 is also shown in a self-aligned T-gate configuration. In contrast to the compound semiconductor FET 460 of FIG. 4B, the compound semiconductor FET 660 also includes stacked trench (CA$_2$) interconnects on the CA$_1$ trench interconnects. In addition, the CB interconnect to the head gate 434 is shown as extending through the fourth dielectric layer 456.

Aspects of the present disclosure are directed to an innovative compound semiconductor FET having self-aligned gates. In addition, the self-aligned gates may have a reduced source/drain-to-gate space (e.g., a range of 10 nanometers to 20 nanometers). Such a device and method enable a low cost compound semiconductor FET (e.g., a gallium nitride (GaN)) device for 5G wireless mobile platform devices. The gallium nitride FET may have self-aligned source/drain regions, while reducing a source/drain-to-gate space to approximately 10 nanometers (e.g., from a minimum 0.25 microns). The reduced source/drain-to-gate space may enable a reduced operating voltage to support mobile platform applications. A gate length is also reduced to a range of 10 nanometers to 20 nanometers.

The reduced gate length Lg, as well as the reduced gate to drain/source space, may enable low voltage operation (e.g., 3V) for mobile devices, such as smartphones. For example, a gate length Lg of a GaN high-electron-mobility transistor (HEMT) (e.g., the compound semiconductor FET 600 (or 660)) may be reduced to ⅒ of the gate length Lg of a GaAs pseudomorphic HEMT (pHEMT) for achieving a channel velocity that matches the GaAs pHEMT. As a result, the GaN HEMT can a achieve a similar knee voltage (Vknee), as well as a similar transmission frequency/maximum frequency (Ft/Fmax) at a lower operating voltage Vdd (e.g., 3V) relative to the GaAs pHEMT.

The GaN HEMT also provides the added advantage of a much higher drain saturation current (Idsat), transconductance (Gm), and a power density. In addition, the knee voltage Vknee of the GaN HEMT can be reduced from approximately 5V to 0.3V due to the 10 times increase of an electric field caused by having a reduced gate length (e.g., ⅒ of the GaAs pHEMT). The higher drain saturation current Idsat, transconductance Gm, and power density are the result of a 4-5 times higher 2D electron Gaussian density (2DEG) with GaN HEMT relative to the GaAs pHEMT.

Aspects of the present disclosure may use a pattern transfer technique combined with an innovative process flow to fabricate a GaN HEMT with a gate length Lg reduced to less than 5 nanometers. In contrast to conventional techniques, the gate length Lg reduction is achieved without an expensive electron beam (e-beam) process, although the e-beam process cannot achieve less than a 20 nanometer gate length Lg. Aspects of the present disclosure provide a significant breakthrough by providing a GaN HEMT for handset applications for 5G wireless communications. A process for fabricating a compound semiconductor FET (e.g., a GaN HEMT), including self-aligned gates according to aspects of the present disclosure, is shown in FIG. 7.

Figure 7:
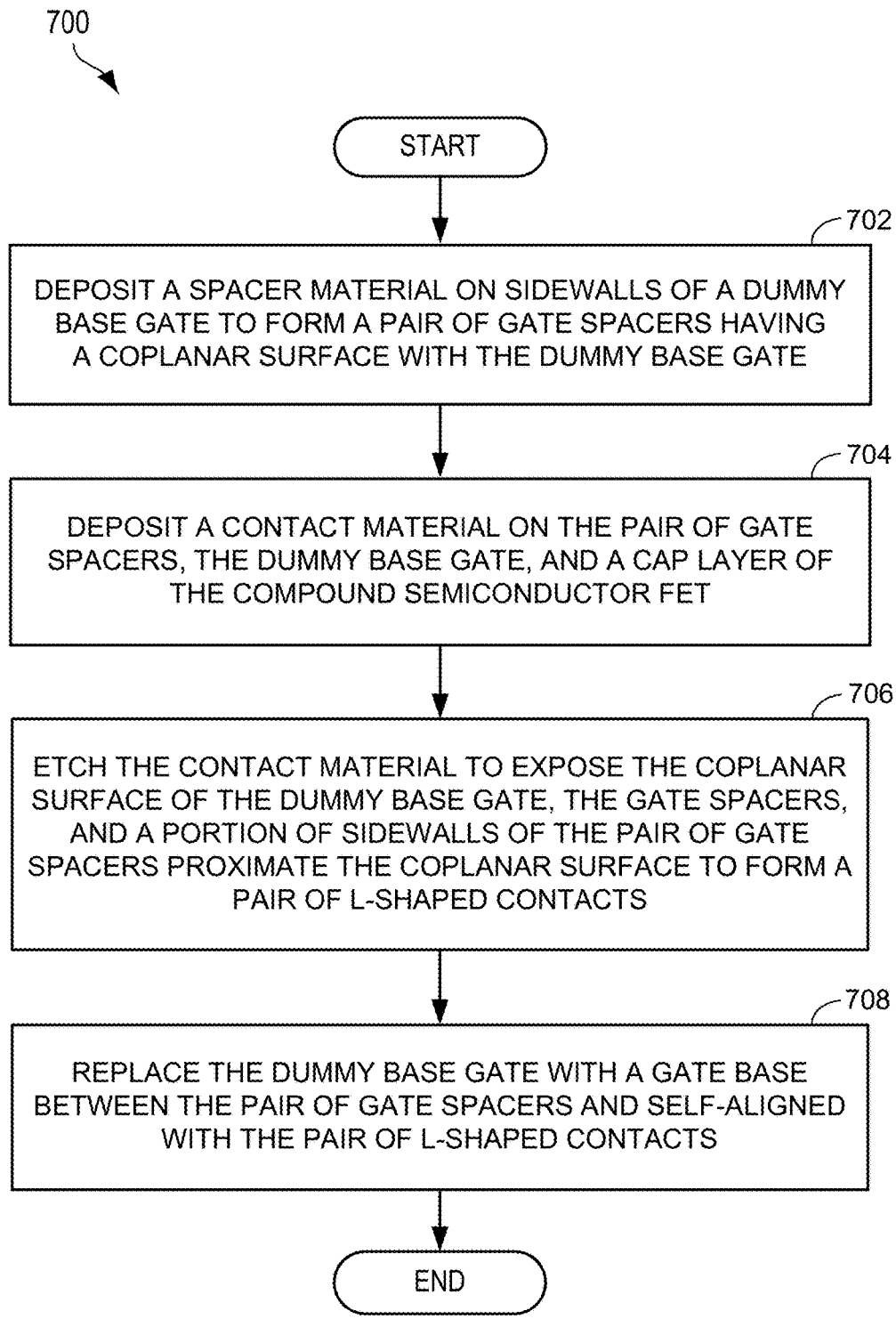
FIG. 7 is a flow diagram illustrating a method of making a compound semiconductor field effect transistor (FET), in accordance with aspects of the present disclosure.

FIG. 7 is a flow diagram illustrating a method 700 of making a compound semiconductor FET, including self-aligned gates, in accordance with aspects of the present disclosure. The blocks in the method 700 can be performed in or out of the order shown, and in some aspects, can be performed at least in part in parallel.

The method 700 begins at block 702, where a spacer material is deposited on sidewalls of a dummy base gate to form a pair of gate spacers having a surface coplanar with the dummy base gate. For example, as shown in FIG. 5D, dielectric gate spacers 422 are formed on sidewalls of a dummy base gate 420. At block 704, a contact material is deposited on the pair of gate spacers, the dummy base gate, and a cap layer of the compound semiconductor FET. For example, as shown in FIGS. 5E and 5F, a source/drain ohmic contact layer 426 is deposited on the dummy base gate 420, the dielectric gate spacers 422, and the cap layer 414, as defined by a photoresist pattern 424 (see FIG. 5E).

Referring again to FIG. 7, at block 706, the contact material is etched to expose the coplanar surface of the dummy base gate and the pair of gate spacers, and a portion of sidewalls of the pair of gate spacers proximate the coplanar surface to form a pair of L-shaped contacts. For example, as shown in FIG. 5G a spin-on oxide may be deposited and processed to form a first dielectric layer 450 as an oxide etch stop layer. As shown in FIG. 5H, an exposed portion 428 of the source/drain ohmic contact layer 426 through the oxide etch stop layer (e.g., the first dielectric layer 450) is etched, with the etch stopping on the oxide etch stop layer to form source/drain ohmic contacts 440 as a pair of L-shaped contacts. The L-shaped contacts may include the planar portion 440P on the cap layer 414 and the orthogonal portion 440O directly contacting the sidewalls of the dielectric gate spacers 422.

Referring again to FIG. 7, at block 708, the dummy base gate is replaced with a base gate between the pair of gate spacers and self-aligned with the pair of L-shaped contacts. For example, as shown in FIGS. 5J and 5K, the dummy base gate 420 is replaced with a base gate 432 of a first conductive gate material (e.g., nickel (Ni)/titanium (Ti)/gold (Au)). As shown in FIG. 5L, a head gate 434 of a second conductive gate material is subsequently formed on the base gate 432 and the dielectric gate spacers 422. The method 700 may further include forming source/drain contacts to the pair of L-shaped contacts as CA contacts. The method 700 may also include forming a gate (CB) contact to the head gate of the compound semiconductor FET.

As shown in FIGS. 6A and 6B, the compound semiconductor FET 600 (or 660, e.g., a gallium nitride (GaN) MOS high-electron-mobility transistor (MOSHEMT)) includes a semi-insulating substrate 402 (e.g., silicon (Si), silicon carbide (SiC), or aluminum oxide ($Al_2O_3$)) and a channel 410 (e.g., gallium nitride (GaN)) on the substrate. The compound semiconductor FET 600 (or 660) also includes a barrier layer 412 (e.g., aluminum gallium nitride (AlGaN)) and a cap layer 414 (e.g., gallium nitride) on the barrier layer 412. The base gate 432 and the dielectric gate spacers 422 are on the cap layer 414 in the Schottky configuration of FIG. 6A. In the MOS configuration of FIG. 6B, the base gate 432 and the dielectric gate spacers 422 are on the gate dielectric layer 418. Similarly, the pair of L-shaped contacts (e.g., ohmic source/drain contacts) directly contacts the dielectric gate spacers 422 and the cap layer 414.

The pair of L-shaped contacts may each include an orthogonal portion 440O and a planar portion 440P. The orthogonal portion 440O of each of the pair of L-shaped contacts, which contacts the dielectric gate spacers 422, is defined by the first dielectric layer 450. A second dielectric layer 452 is on the first dielectric layer 450 (e.g., the oxide layer) and contacts the dielectric gate spacers 422. A head gate 434 contacts the base gate 432, the dielectric gate spacers 422, and the second dielectric layer 452. A third dielectric layer 454 is on the second dielectric layer 452 and contacts sidewalls of the head gate 434. A fourth dielectric layer 456 is on the third dielectric layer 454 and on the head gate 434. Source/drain (CA) contacts to the pair of L-shaped source/drain contacts extend through the first, second, third, and fourth dielectric layers. In addition, a gate (CB) contact to the head gate 434 extends through the fourth dielectric layer 456.

According to a further aspect of the present disclosure, a compound semiconductor FET is described. The compound semiconductor FET may include means for supporting the compound semiconductor FET. The supporting means may, for example, include a semi-insulating substrate, as shown in FIGS. 4A, 4B, 6A, and 6B. In another aspect, the aforementioned means may be any layer, module, or any apparatus configured to perform the functions recited by the aforementioned means.

According to additional aspects of the present disclosure, a compound semiconductor material may include, but is not limited to, gallium nitride (GaN), gallium arsenide (GaAs), indium phosphide (InP), gallium stibium (GaSb), gallium phosphide (GaP), indium gallium arsenide (InGaAs), aluminum gallium arsenide (AlGaAs), indium gallium phosphide (InGaP), aluminum gallium phosphide (AlGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide:nitride (InGaAs:N). These are exemplary only, and other materials are possible.

Figure 8:
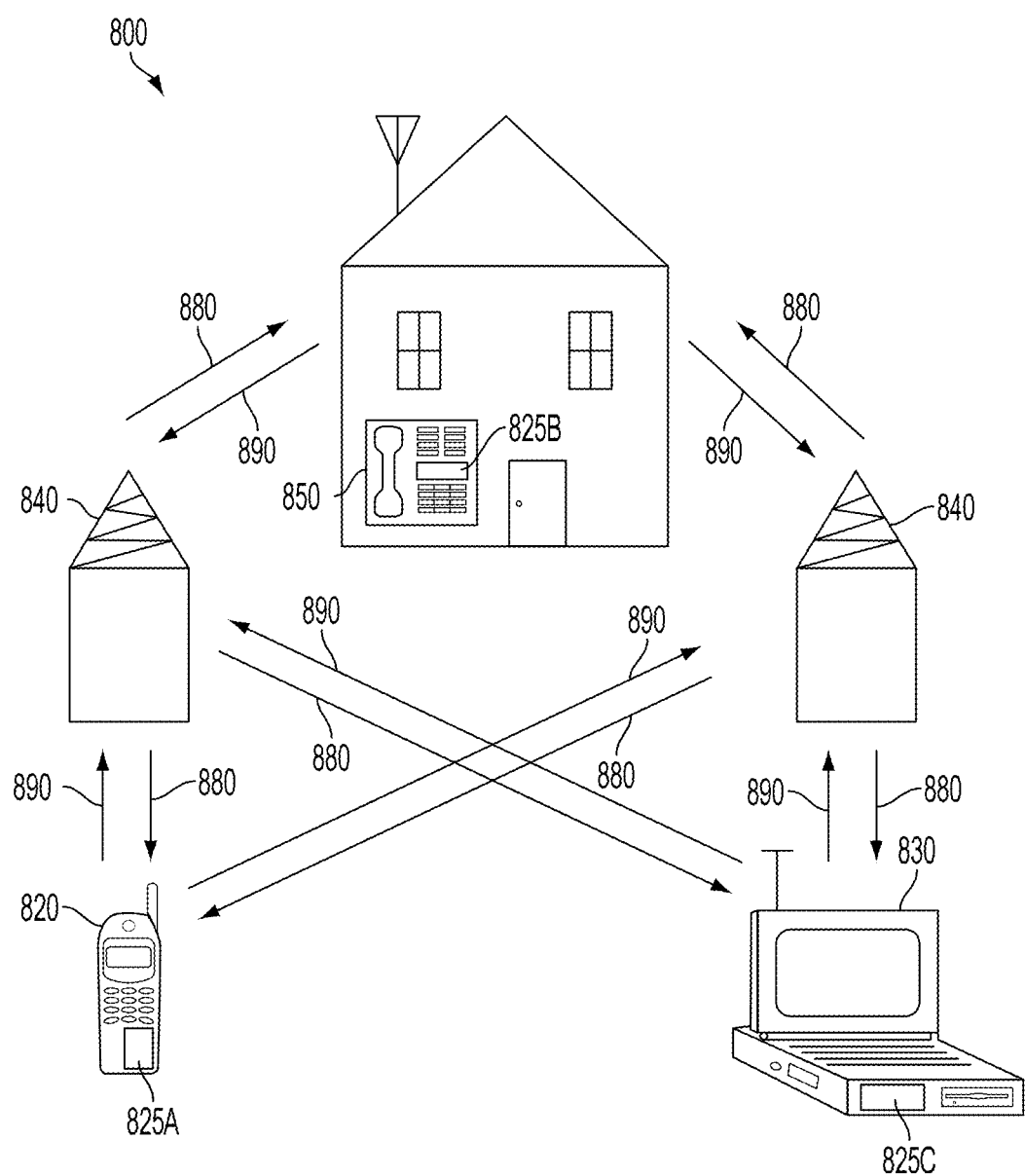
FIG. 8 is a block diagram showing an exemplary wireless communication system in which an aspect of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed compound semiconductor field effect transistor. It will be recognized that other devices may also include the disclosed compound semiconductor field effect transistor, such as the base stations, user equipment, and network equipment. FIG. 8 shows forward link signals 880 from the base station 840 to the remote units 820, 830, and 850 and reverse link signals 890 from the remote units 820, 830, and 850 to base station 840.

In FIG. 8, remote unit 820 is shown as a mobile telephone, remote unit 830 is shown as a portable computer, and remote unit 850 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed compound semiconductor field effect transistor.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described herein may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination of set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A compound semiconductor field effect transistor (FET), comprising:
    gallium nitride (GaN) and alloy material layers;
    a pair of L-shaped contacts on the GaN and alloy material layers;
    a pair of gate spacers between the pair of L-shaped contacts and on the GaN and alloy material layers, each of the pair of gate spacers contacting one of the pair of L-shaped contacts; and
    a base gate between the pair of gate spacers and on the GaN and alloy material layers, in which the pair of L-shaped contacts is self-aligned with the base gate, and in which the pair of L-shaped contacts comprises a planar portion on a GaN cap layer of the GaN and alloy material layers and an orthogonal portion on the GaN cap layer and in contact with sidewalls of the pair of gate spacers, the orthogonal portion of the pair of L-shaped contacts extending toward a coplanar surface of the base gate and the pair of gate spacers, distal from the GaN cap layer of the GaN and alloy material layers.

2. The compound semiconductor FET of claim 1, further comprising a head gate on the base gate.

3. The compound semiconductor FET of claim 1, in which the compound semiconductor FET comprises a GaN high-electron-mobility transistor (HEMT) or a GaN pseudomorphic high-electron-mobility transistor (pHEMT).

4. The compound semiconductor FET of claim 1, in which a source/drain region of the compound semiconductor FET is self-aligned with the base gate.

5. The compound semiconductor FET of claim 1, in which the pair of L-shaped contacts comprises source/drain regions of the compound semiconductor FET.

6. The compound semiconductor FET of claim 5, in which a space between the base gate and the source/drain regions is in a range of 10 nanometers to 20 nanometers.

7. The compound semiconductor FET of claim 1, in which a gate length of the base gate is 10 nanometers.

8. The compound semiconductor FET of claim 1, further comprising a gate dielectric layer between the base gate and the GaN and alloy material layers.

9. The compound semiconductor FET of claim 1, integrated into a power amplifier.

10. The compound semiconductor FET of claim 9, in which the power amplifier is incorporated into at least one of a music player, a video player, an entertainment unit, a navigation device, a communications device, a personal digital assistant (PDA), a fixed location data unit, a mobile phone, and a portable computer.

11. A radio frequency (RF) front end module, comprising:
    a chip, comprising a compound semiconductor field effect transistor (FET), comprising gallium nitride (GaN) and alloy material layers, a pair of L-shaped contacts on the GaN and alloy material layers, a pair of gate spacers between the pair of L-shaped contacts and on the GaN and alloy material layers, each of the pair of gate spacers contacting one of the pair of L-shaped contacts, and a base gate between the pair of gate spacers and on the GaN and alloy material layers, the pair of L-shaped contacts being self-aligned with the base gate; and
    an antenna coupled to an output of the chip, in which the pair of L-shaped contacts comprises a planar portion on a GaN cap layer of the GaN and alloy material layers and an orthogonal portion on the GaN cap layer and in contact with sidewalls of the pair of gate spacers, the orthogonal portion of the pair of L-shaped contacts extending toward a coplanar surface of the base gate and the pair of gate spacers, distal from the GaN cap layer of the GaN and alloy material layers.

12. The RF front end module of claim 11, further comprising a head gate on the base gate.

13. The RF front end module of claim 11, in which the compound semiconductor FET comprises a GaN high-electron-mobility transistor (HEMT) or a GaN pseudomorphic high-electron-mobility transistor (pHEMT).

14. The RF front end module of claim 11, in which a source/drain region of the compound semiconductor FET is self-aligned with the base gate.

15. The RF front end module of claim 11, in which the pair of L-shaped contacts comprises source/drain regions of the compound semiconductor FET.

16. The RF front end module of claim 11, in which the compound semiconductor FET further comprises a gate dielectric layer between the base gate and the GaN and alloy material layers.

17. The RF front end module of claim 11, incorporated into at least one of a music player, a video player, an entertainment unit, a navigation device, a communications device, a personal digital assistant (PDA), a fixed location data unit, a mobile phone, and a portable computer.

* * * * *